US012574034B2

(12) United States Patent
Deymier et al.

(10) Patent No.: US 12,574,034 B2
(45) Date of Patent: Mar. 10, 2026

(54) SYSTEMS AND METHODS FOR QUANTUM-LIKE GATES USING ACOUSTIC QUANTUM BIT ANALOGUES

(71) Applicant: Arizona Board of Regents on Behalf of the University of Arizona, Tucson, AZ (US)

(72) Inventors: Pierre A. Deymier, Tucson, AZ (US); Keith Runge, Tucson, AZ (US)

(73) Assignee: Arizona Board of Regents on Behalf of the University of Arizona, Tucson, AZ (US)

( * ) Notice: Subject to any disclaimer, the term of this patent is extended or adjusted under 35 U.S.C. 154(b) by 0 days.

(21) Appl. No.: 18/841,666

(22) PCT Filed: Mar. 1, 2023

(86) PCT No.: PCT/US2023/063515
§ 371 (c)(1),
(2) Date: Aug. 26, 2024

(87) PCT Pub. No.: WO2024/172847
PCT Pub. Date: Aug. 22, 2024

(65) Prior Publication Data
US 2025/0175181 A1      May 29, 2025

Related U.S. Application Data

(60) Provisional application No. 63/315,448, filed on Mar. 1, 2022.

(51) Int. Cl.
*H03K 19/195* (2006.01)
*G06N 10/00* (2022.01)
(Continued)

(52) U.S. Cl.
CPC ........... *H03K 19/195* (2013.01); *G06N 10/00* (2019.01); *G06N 10/20* (2022.01); *G06N 10/40* (2022.01)

(58) Field of Classification Search
CPC ...... H03K 19/195; G06N 10/40; G06N 10/20; G06N 10/00
(Continued)

(56) References Cited

U.S. PATENT DOCUMENTS

| | | |
|---|---|---|
| 5,218,653 A | 6/1993 | Johnson et al. |
| 5,748,810 A | 5/1998 | Schmid |

(Continued)

FOREIGN PATENT DOCUMENTS

| | | | |
|---|---|---|---|
| WO | WO-2015178990 A2 | * 11/2015 | ......... G06F 13/4068 |

OTHER PUBLICATIONS

Patent Cooperation Treaty, International Search Report and Written Opinion, International Application No. PCT/US23/63515, date of mailing Aug. 20, 2024, 13 pages.
(Continued)

*Primary Examiner* — Arnold M Kinkead
(74) *Attorney, Agent, or Firm* — Polsinelli PC

(57) ABSTRACT

Disclosed are systems and methods for implementing quantum-like gate operation using logical phi-bits of a quantum analogue system for achieving controllable classical entanglement. A method can include driving an array of elastically coupled acoustic waveguides using a first frequency and a second frequency different from the second frequency. A plurality of logical phi-bits can be determined based on acoustic field measurements associated with the waveguides. A tuning parameter value associated with a selected set of logical phi-bits can be determined, wherein the tuning parameter value is associated with a unitary transformation of a state of the selected set of logical (Continued)

phi-bits. A unitary gate operation can be implemented for the selected set of logical phi-bits by tuning an external driver coupled to a particular acoustic waveguide of the array by using the tuning parameter value to adjust one or more of the first frequency or the second frequency.

15 Claims, 16 Drawing Sheets

(51) Int. Cl.
G06N 10/20 (2022.01)
G06N 10/40 (2022.01)
(58) Field of Classification Search
USPC ...... 331/107 A, 107 S; 326/1, 4, 7; 977/962;
257/14; 327/366, 527, 528
See application file for complete search history.

(56) References Cited

U.S. PATENT DOCUMENTS 5,818,980 A 10/1998 Herrmann
5,850,491 A 12/1998 Morasca et al.

OTHER PUBLICATIONS

Hasan, A. H. et al. "Experimental classical entanglement in a 16 acoustic qubit-analogue," Scientific Reports, vol. 11, Dec. 20, 2021, 15 pages.

* cited by examiner

FIG. 1

(Contineud)

400a—

400b—

1100

1200

1400

SYSTEMS AND METHODS FOR QUANTUM-LIKE GATES USING ACOUSTIC QUANTUM BIT ANALOGUES

CROSS-REFERENCE TO RELATED APPLICATIONS

This application claims the benefit of U.S. Provisional Application No. 63/315,448, filed Mar. 1, 2022, which is hereby incorporated by reference, in its entirety and for all purposes.

GOVERNMENT SUPPORT

This invention was made with government support under Grant No. 1640860 awarded by the National Science Foundation. The government has certain rights in the invention.

FIELD

The present disclosure generally relates to quantum-analogue computing, and in particular relates to acoustic-based logical phi-bits.

BACKGROUND

Quantum information science exploits quantum-mechanical phenomena to perform computing operations. Quantum bit (e.g., "qubit") based computing platforms capitalize on the phenomenon of superposition. Because of superposition, a quantum computer can simultaneously process a number of calculations beyond that which can be achieved with conventional transistor-based processors. Superposition is essentially the ability of a system to be in multiple states— that is, instead of encoding information in the form of a '0' or a '1' as in conventional computing bits, a qubit can store and process a '0' or a '1' at the same time. When qubits are entangled, the state of an array of N qubits cannot be separated into a tensor product of states of individual qubits. With entangled states, quantum exponential complexity can be achieved, as entangled states of an N qubit system can simultaneously store and process $2^N$ bits of information.

Early proposals for a quantum mechanical computer emphasized the computation process, and in particular the logic gates that carry operations. These gates can be provided as reversible unitary operations acting on an input to produce a predictable and possibly measurable output state. For example, the input can be a state or a superposition of states of quantum bits (e.g., qubits). The realization of various quantum controlled gates, including a quantum controlled-NOT (e.g., C-NOT) gate (e.g., a two-bit gate) has been desirable, as a quantum C-NOT gate can be used in conjunction with a small number of single-bit quantum gates to form a universal set of quantum gates. A quantum C-NOT gate has been demonstrated for quantum bits stored in the degrees of freedom of trapped atoms, trapped ions, superconducting qubits, photons, and solid-state spins. A quantum C-NOT gate has also been proposed in topological quantum bits.

Advantages of qubits over conventional bits can result from the properties of qubit quantum wave functions (e.g., probability amplitudes), which can support coherent superpositions of multipartite states (e.g., entangled states). However, quantum computing with multiple bits can suffer from the fragility of quantum superpositions of states against perturbations or undesired interactions. Increasing the performance of quantum gates, therefore, can require cumbersome strategies for suppressing environmental effects and performing error corrections.

Acoustic waves can also support coherent superpositions of states, in a same or similar manner as in existing approaches for achieving quantum bits with classically entangled states. Moreover, the coherent superpositions of states supported by acoustic waves are robust, as classical wave functions are amplitudes. The notion of "classical entanglement" that can be supported by acoustic waves possesses the non-separability and related complexity that are essential to reach the promise of parallelism in quantum computing, but not the non-local aspect of quantum entanglement. Since quantum computing harnesses the non-separability of entangled states, non-separable classical waves can therefore serve as a resource to complement quantum systems in harnessing the power of complexity in information processing.

It is with these observations in mind, among others, that various aspects of the present disclosure were conceived and developed.

BRIEF DESCRIPTION OF THE DRAWINGS

Corresponding reference characters indicate corresponding elements among the view of the drawings. The headings used in the figures do not limit the scope of the claims.

DETAILED DESCRIPTION

Figure 1:
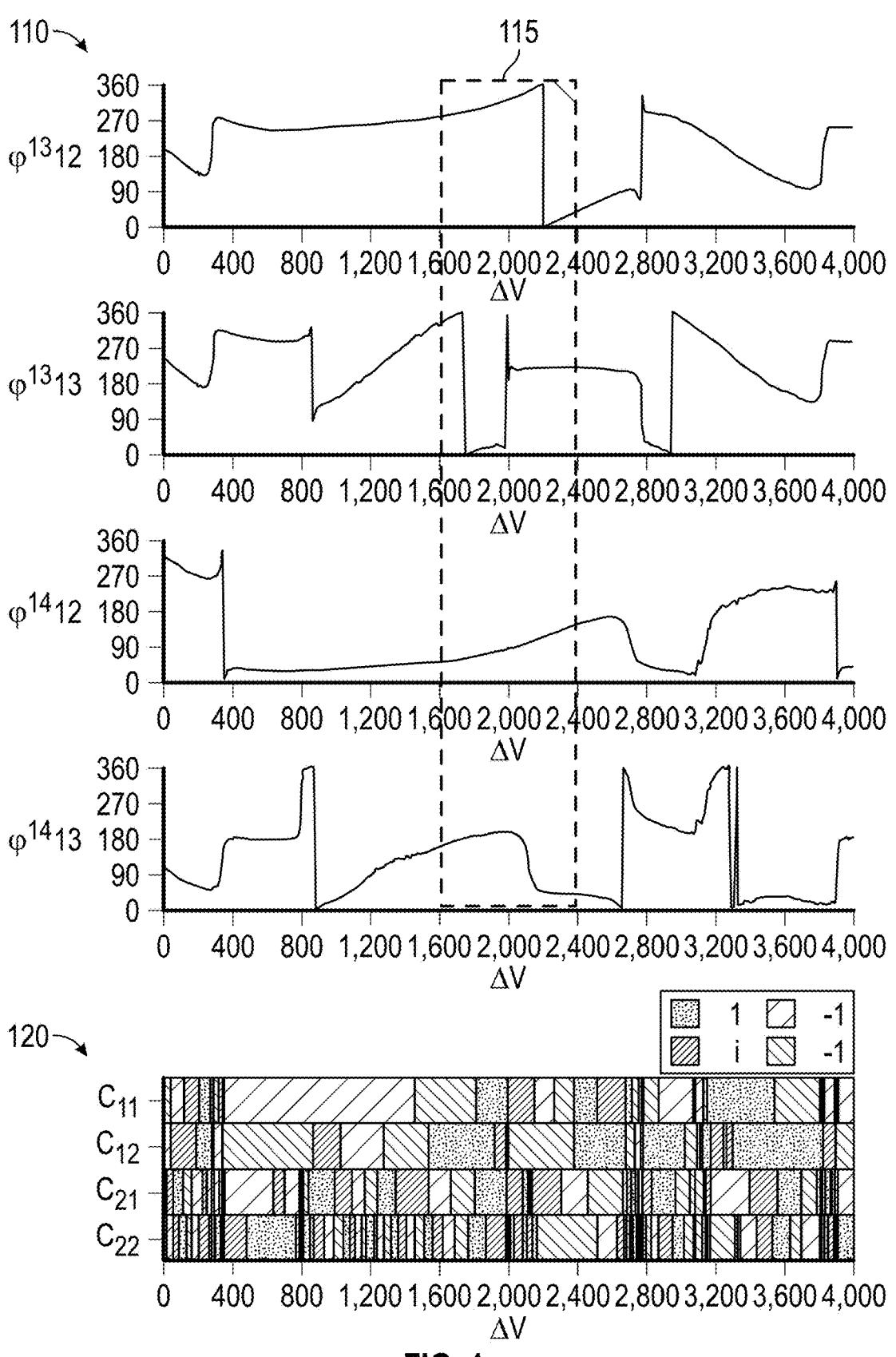
FIG. 1 is a graph depicting measured relative phases for an example phi-bit of a plurality of phi-bits.

The present disclosure relates to quantum-like gates implemented using classical acoustic qubit-analogues, such as acoustic-based logical phi-bits. For example, quantum-like gates can include a two-bit controlled-NOT (C-NOT) gate, a one-bit Hadamard gate, a one-bit phase gate, a three-bit gate, and/or various other multi-bit gates and gate operations, each of which may be implemented using one or more classical acoustic qubit-analogues, such as acoustic-based logical phi-bits.

To achieve this goal, it is important to understand and solve different challenges.

Physical acoustic phase-bits (e.g., phi-bits) in acoustic metamaterials have been introduced as a classical analogue of a qubit. For example, a phi-bit associates with a two-state degree of freedom of an acoustic wave, which can be in a coherent superposition of states with complex amplitude coefficients. Phi-bits can be expanded from the physical to the logical realm. Logical phi-bits can be designed to exploit the strong coupling and nonlinearity of acoustic waves to realize non-separable superpositions of states spanning exponentially complex spaces (e.g., Hilbert spaces), which can permit the development of algorithms that exploit the computational parallelism arising from non-separability.

Systems, apparatuses, and methods (collectively referred to as "systems and techniques") are described herein for implementing quantum-like gate operations using qubit analogues, such as logical phi-bits. For example, a two-bit C-NOT quantum-like gate can be provided using logical phi-bits. Quantum-like gate operations can additionally, or alternatively, include one or more of a Hadamard quantum-like gate, a phase quantum-like gate, and/or various other one-bit, two-bit, three-bit, and/or multi-bit quantum-like gate operations. In some embodiments, the logical phi-bits can be supported by an externally driven nonlinear acoustic metamaterial that includes a parallel array of elastically coupled waveguides. In some embodiments, the nonlinear acoustic metamaterial can include a parallel array of three elastically coupled waveguides and the logical phi-bits can have a two-state degree of freedom associated with the two independent relative phases of an acoustic wave in the three waveguides.

As will be described in greater depth below, one or more frequencies of the external driver(s) of the nonlinear acoustic metamaterial can be de-tuned, for example by a physical manipulation. The de-tuning of the frequency of an external driver can operate on the complex vectors in the Hilbert space of pairs of logical phi-bits. Based at least in part on the de-tuning operation, a systematic and predictable C-NOT gate can be implemented with unambiguously measurable input and output. Additionally, it is contemplated that aspects of the present disclosure can be scaled to include a greater number of phi-bits.

I. Logical Phi-Bits

Logical phi-bits can be implemented based on nonlinear acoustic modes supported by an externally driven acoustic metastructure, and may be considered analogous to quantum qubits. When driven externally with two different frequencies, a metamaterial composed of an array of three elastically coupled acoustic waveguides produces a nonlinear displacement field that can be partitioned in the frequency domain. An example array comprising three elastically coupled acoustic waveguides is described below for purposes of example, although it is noted that other arrays and/or waveguide constructions may also be utilized without departing from the scope of the present disclosure. In some embodiments, each waveguide can be provided as an aluminum rod with a circular cross section and of a finite length, wherein the rods are arranged in a linear array. Lateral gaps (e.g., between the rods) can be filled with epoxy.

Ultrasonic transducers can be used to drive and detect the acoustic field at the ends of the rods. For example, a first ultrasonic transducer can be provided at a first distal end of a rod (e.g., a driving end) and a second ultrasonic transducer can be provided at a second distal end of the rod (e.g., a detection end). In some cases, each rod can be associated with a pair of ultrasonic transducers, although it is also contemplated that a single ultrasonic transducer can be used to drive and/or detect the acoustic field(s) at the distal ends of multiple rods.

In one illustrative example, two driving transducers can be attached to one respective end of a first and second waveguide (e.g., aluminum rod). Function generators and amplifiers can be used to excite the two driving transducers with sinusoidal signals of frequencies $f_1$ and $f_2$, respectively. Three detecting transducers can be attached to or otherwise located at the opposite ends of the waveguides and used to collect data on the displacement field(s) (e.g., acoustic field(s)).

The nonlinearity of this driven system leads to many ways of mixing the drivers' frequencies. For example, the measured displacement field (e.g., acoustic field) at the detection end of the waveguides can be determined as the Fourier sum of a large number of linear and nonlinear modes, each with its own characteristic frequency. Phi-bits can be based on the nonlinear modes determined from the measured displacement field associated with the waveguides, and can be correlated through the nonlinear interactions of the waveguide-transducer-amplifier-generator assembly.

Accordingly, in some embodiments, a logical phi-bit can be defined as a two-level nonlinear mode of vibration whose state is characterized by a nonlinearly mixed frequency and spatial mode associated with two independent relative phases of the displacement (e.g., a displacement field or acoustic field) between the waveguides. It is noted that because the logical phi-bits co-locate within the same physical space, the logical phi-bits may be subjected to distance-independent interactions. Recently, it has been shown experimentally and theoretically that tensor product structures of systems comprising large numbers of logical phi-bits (e.g., 16 logical phi-bits) can support non-separable states in scalable exponentially complex Hilbert spaces. For example, non-separability can be identified by the nonzero von Neumann entropies of various partitioning of the 16 logical phi-bit system.

II. Acoustic Quantum-Like Gates: Controlled-NOT (C-NOT) Gate

As disclosed herein, it can be experimentally demonstrated that the Hilbert space of pairs of logical phi-bits can be navigated in a controllable manner to achieve a systematic and predictable C-NOT gate with unambiguously measurable input and output. Accordingly, aspects of the present disclosure can be used to provide the foundations for acoustic quantum-like gates.

The state of a phi-bit associated with a nonlinear acoustic mode i in an externally driven three-waveguide nonlinear system can be given by the following 2×1 vector representation:

$$\vec{U}_{(i)} = \begin{pmatrix} \hat{c}_2 e^{i\varphi_{12}^i} \\ \hat{c} e^{i\varphi_{13}^i} \end{pmatrix} e^{i\omega^{(i)}t} \qquad \text{Eq. (1)}$$

where the nonlinear angular frequency $\omega^{(i)}$ is a mixture of the driving frequencies applied to the waveguides. The magnitudes $\hat{C}_2$ and $\hat{C}_3$ associated with waveguides 2 and 3, respectively, are normalized to that of waveguide 1. $\varphi_{12}^i = \varphi_2^i - \varphi_1^i$ and $\varphi_{13}^i = \varphi_3^i - \varphi_1^i$ represent the two independent phases in waveguides 2 and 3 relative to that of waveguide 1. Amplitude and phases can be measured unambiguously at the ends of the waveguides. This single phi-bit state given in Eq. (1) exists in a two-dimensional Hilbert space, $h_{(i)}$.

In some embodiments, the state of a non-interacting P phi-bit system can be determined as the tensor products of single phi-bit states, namely: $\vec{W} = \vec{U}_{(i)} \otimes \ldots \otimes \vec{U}_{(P)}$. In particular, the tensor product of the basis vectors of single phi-bits forms a complete basis for the states of the non-interacting multi phi-bit system. This basis defines a $2^P$ dimensional Hilbert space H, where H is the tensor product of the P Hilbert spaces of the individual non-interacting phi-bits, $H = h_{(1)} \otimes \otimes h_{(P)}$.

In the case of the nonlinear coupled waveguide system described herein, phi-bits interact, and the Hilbert space spanned by the states of the interacting system is the same as for a non-interacting system. However, a state of the interacting system may now be a separable or non-separable linear combination (e.g., with complex coefficients) of the basis vectors of H. Different representations of the P logical phi-bit system can then be defined by applying unitary transformations to the basis of H. Focus can be given to representations leading to a multipartite tensor product structure that is conditioned by the measurability of the phases of each logical phi-bit. In some embodiments, representations can be selected based on their practicality in implementing quantum-like gates.

As noted previously, the C-NOT gate is a two-bit gate. As such, representations were investigated involving two logical phi-bits (e.g., among the 16 available in the logical phi-bit system referred to in the context of the present example). Representations were considered such that the complex coefficients of states of a system constituted of any two different logical phi-bits i and j take the form:

$$\vec{W}^{ij} = \begin{pmatrix} C_{11}^{ij} \\ C_{12}^{ij} \\ C_{21}^{ij} \\ C_{22}^{ij} \end{pmatrix} \qquad \text{Eq. (2)}$$

where $C_{11}^{ij} = \exp[mi(\varphi_{12}^i + \varphi_{12}^j)]$, $C_{12}^{ij} = \exp[ni(\varphi_{13}^i + \varphi_{12}^j)]$, $C_{12}^{ij} = \exp[pi(\varphi_{12}^i + \varphi_{12}^i)]$, and $C_{22}^{ij} = \exp[qi(\varphi_{13}^i + \varphi_{13}^j)]$ and the set $\{n, m, p, q\}$ are permutations of the integers 1, 2, 3 and 4. Note that this representation differentiates the pairs ij and ji. There are 24 such representations for each pair of phi-bits. Each representation exists in the four-dimensional Hilbert spaces, $H = h_{(i)} \otimes h_{(j)}$.

The complex coefficients of these representations (e.g., described by Eq. (2)), through the relative phases, are dependent on the driving frequencies $f_1$ and $f_2$ and are therefore tunable. In one illustrative example, with $f_1 = 62$ kHz and $f_2 = 66$ kHz, $f_1$ can be modified in the form $f_1 = \Delta v$ while keeping $f_2$ constant. $\Delta v$ is a frequency tuning parameter $\Delta v$ and can be varied by increments of 10 Hz, up to 4 kHz.

The disclosure turns now to FIG. 1, which is a diagram illustrating the measured relative phases for phi-bit 13 (e.g., the measured relative phases $\varphi_{12}^i$ and $\varphi_{13}^i$ for i=13; recalling that $\varphi_{12}^i$ and $\varphi_{13}^i$ represent the two independent phases in waveguides 2 and 3 relative to that of waveguide 1, respectively). With respect to the graphs 110, 120, 130, 140 of FIG. 1, spurious 360° discontinuities may be disregarded.

Graph 110 depicts an example of measured variations of the relative phases $\varphi_{12}^{(i)}$ and $\varphi_{13}^{(i)}$ for phi-bits i=13, 14. The phases are shown on the vertical axis (e.g., y-axis) and are given in degrees. The tuning parameter $\Delta v$ is shown on the horizontal axis (e.g., x-axis) and is given in Hertz (Hz).

Graph 130 provides an enlarged view of the region 115 indicated in graph 110. In particular, the region 115 (e.g., which is depicted in graph 130) corresponds to frequencies between 1.6 and 2.4 kHz.

Graph 120 provides a visualization of the four values of the four components of the two phi-bit representation over the entire range of the tuning parameter $\Delta v$ (e.g., the entire range of graph 110).

Graph 140 provides a visualization of the four values of the four components of the two phi-bit representation over the range of the focused region 115 (e.g., the entire range of graph 130) where a Controlled-NOT (C-NOT) gate operation, as described in greater depth below, may be implemented.

It is observed that the two measured relative phases for phi-bit 13, $\varphi_{12}^{13}$ and $\varphi_{13}^{13}$, undergo a number of slow, monotonous variations in addition to a number of resonant jumps of various magnitudes (including 90° and 180°). The relative phases of phi-bits undergo multiple resonant and non-resonant scattering processes as a consequence of the non-linearities of the system. It is additionally noted that some phi-bits exhibit only monotonous changes in phase, some of which extend over broad ranges of possible angles (not shown).

The repeatability of the phase measurement described herein and illustrated in the example of FIG. 1 was verified. Some variations were found over an experimental period of several months. Although there is no limit on the stability of acoustic waves in the ultrasonic frequency domain, nor on the accuracy of the measurement of phases of acoustic waves, the observed variations may likely be attributable to aging of one or more components of the experimental setup (e.g., the organic ultrasonic coupling agent between rod and transducer and/or rubber-based rod-transducer attachments). In some embodiments, phase measurements appear to be conservatively accurate to 20 degrees.

Figure 2:
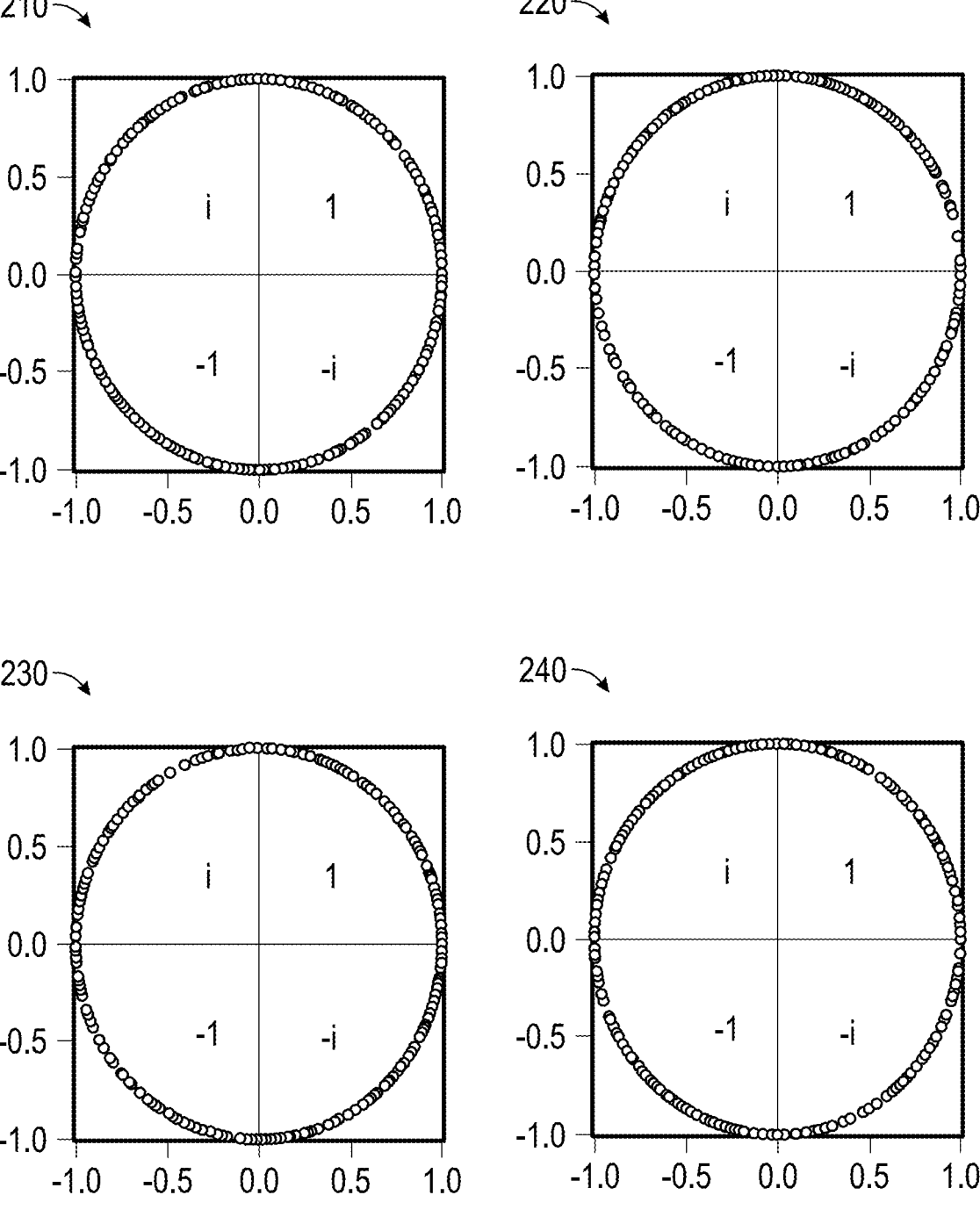
FIG. 2 is a graph depicting complex components of an example four-vector of states of an example two phi-bit system over a plurality of values of a frequency tuning parameter.

FIG. 2 illustrates a series of graphs (a)-(d) (e.g., graphs 210, 220, 230, and 240, respectively) that depict the components of $\vec{W}^{i=13\ j=14}$ for all recorded values of the tuning parameter in the case of the representation {m=2, n=1, p=3, q=4}} for the pair of phi-bits 13 and 14. For example, the tuning parameter can be the $\Delta v$ tuning parameter applied to the frequency $f_1$, as described previously. As illustrated in FIG. 2, each complex coefficient covers the unit circle well, although a few gaps are noticeable. Because of the precision in the measurement of phase associated with the example experimental apparatus described herein, as well as to simplify the search for a C-NOT unitary operation in the Hilbert space of pairs of phi-bits, the complex circle for each pair of phi-bits can be reduced to four quarters. The values of 1, i, −1, and −i can be assigned to component data with 90° slices centered around 0° for the value of 1, centered around 90° for the value i, centered around 180° for the value −1, and centered around 270° for the value −i. For each pair of phi-bits, the four-vector $\vec{W}^{ij}$ can take $4^4$=256 possible values.

Unitary transformations such as the C-NOT gate can be represented by unitary matrices. In the case of two phi-bits, there are 6 such unitary matrices of which the most common form is:

$$U_{CNOT} = \begin{pmatrix} 1 & 0 & 0 & 0 \\ 0 & 1 & 0 & 0 \\ 0 & 0 & 0 & 1 \\ 0 & 0 & 1 & 0 \end{pmatrix} \qquad \text{Eq. (3)}$$

Other matrices can be obtained by permutations of the diagonal and off-diagonal non-zero entries of Eq. (3). In some embodiments, a search can be conducted for a transformation that, when applied on one input (e.g., one of the 256 possible values for the four-vector $\vec{W}^{ij}$ $\overline{\overline{W^{ij}}}$ states associated with a given pair of phi-bits, in their 4-dimensional Hilbert) systematically produces an output that is both reproducible and predictable. This output is the C-NOT transformed counterpart for the input.

For each of the P(P−1)=240 phi-bit pairs ij, there are 24 possible combinations of representations with coefficients {m, n, p, q} and 6 possible C-NOT matrices for all values of the frequency tuning parameter. Therefore, for each of the 240 possible phi-bit pairs, there are additionally 24×6=144 combinations of representations and C-NOT gates.

Each of the 240×24×6=34,560 combinations of phi-bit pairs, representations, and C-NOT gates are then examined for all values of the frequency tuning parameter $\Delta v$. One combination yields all 256 transformations for a given frequency change; that is the representation {m=2, n=1, p=3, q=4} and the common C-NOT matrix shown above in Eq. (3). Furthermore, and importantly, there is at least one one-frequency transformation that can be applied to every four-vector state to produce its C-NOT transformed counterpart, for instance by reducing $f_1-\Delta v$ by 100 Hz, e.g., by increasing $\Delta v$ by 100 Hz.

For example, the four-vector $$\vec{W}^{i=13\,j=3} = \begin{pmatrix} i \\ i \\ i \\ 1 \end{pmatrix}$$

which is realized at $\Delta v$=1.31 kHz transforms for the same pair of phi-bits to the vector $$\begin{pmatrix} i \\ i \\ 1 \\ i \end{pmatrix}$$

by simply changing the parameter $\Delta v$ to 1.51 kHz.

Similarly, the four-vector $$\vec{W}^{i=4\,j=15}(\Delta v = 3.09 \text{ kHz}) = \begin{pmatrix} 1 \\ i \\ 1 \\ -1 \end{pmatrix}$$

transforms for the same pair of phi-bits to $$\vec{W}^{i=4\,j=15}(\Delta v = 3.19 \text{ kHz}) = \begin{pmatrix} 1 \\ i \\ -1 \\ 1 \end{pmatrix}.$$

A complete list of four-vectors and their corresponding phi-bit pairs and frequency tuning parameters are provided in Appendix A attached herein.

In another example, the four vector $$\vec{W}^{i=13\,j=14} = \begin{pmatrix} 1 \\ 1 \\ 1 \\ i \end{pmatrix}$$

which is realized at $\Delta v$=1.89 kHz transforms for the same pair of phi-bits to the vector $$\begin{pmatrix} 1 \\ 1 \\ i \\ 1 \end{pmatrix}$$

by simply changing the parameter to $\Delta v$=1.99 kHz. This transformation is depicted in the graph 140 of FIG. 1, encoding the values using colors, where the red (i) value swaps from the fourth row to the third. Similarly, although not shown visually, $$\overline{W}^{j=5,j=6} \Delta v = 0.78 \text{ kHz} = \begin{pmatrix} 1 \\ i \\ 1 \\ -1 \end{pmatrix}$$

transforms to $$\overline{W}^{j=5,j=6} \Delta v = 0.88 \text{ kHz} = \begin{pmatrix} 1 \\ i \\ -1 \\ 1 \end{pmatrix}.$$

In some examples, implementation of a C-NOT gate within the context of a chosen representation can be performed using a computer program referred to in quantum computing as an oracle, which for a given four-vector input can configure or otherwise perform setup of a physical system (e.g., setting the driving frequencies, frequency tuning parameter, and corresponding pair of logical phi-bits ij, which determine the set of measurable input phases: $\varphi_{12}{}^i$, $\varphi_{13}{}^i$, $\varphi_{12}{}^j$, $\varphi_{13}{}^j$) The C-NOT gate operation can then be conducted by reducing the driving frequency of the first waveguide by 100 Hz, independently of the input. The computer program (e.g., oracle) can subsequently read the C-NOT transformed four-vector output from the phases associated with the new state of the same phi-bit pair. Notably, these phases are directly measurable. Accordingly, aspects of the present disclosure demonstrate that acoustic metamaterials can be used to operate on complex vectors in the Hilbert space of pairs of logical phi-bits to achieve a systematic and predictable C-NOT gate with unambiguously measurable input and output.

⌐|⌐|⌐| The approaches and results described above demonstrate the feasibility and practicality of employing an externally driven nonlinear acoustic-metamaterial platform supporting logical phi-bits to realize a two-bit quantum-like C-NOT gate. The gate operation can be achieved with a physical manipulation involving the de-tuning of the frequency of one of the external drivers. This approach is scalable as the apparatus can support exponentially complex Hilbert spaces of multiple phi-bits. In some embodiments, the precision of the experimental setup described in the example above can be increased (e.g., by using non-aging materials and/or permanent attachments). Based on an increase in precision, a greater number of states in the Hilbert space of multiple phi-bits could be spanned. For instance, the unit circle can be discretized into $2^3=8$ parts rather than the four discretized parts referred to above with respect to FIG. 2. With the complete set of 16 logical phi-bits, the representation of $8^{16}$ or $2^{48}$ unique vectors in a $2^{16}$-dimensional Hilbert space is contemplated. Therefore, the nonlinear array including three acoustic waveguides with two drivers, as described herein, can implement the data manipulation capacity of 48 fully classically entangled qubit-analogues.

III. Acoustic Quantum-Like Gates: Predictable Quantum-Like Operations Using Phase Jumps The disclosure turns now the application of the observed nonlinear behavior to information processing. Recall that a logical phi-bit "j" can be characterized by a displacement field (e.g., acoustic field) measured at the ends of the rods (e.g., included in an array of elastically coupled rods or other acoustic waveguides, as described above) taking the general form as seen in Eq. (1), above, of:

$$\vec{U}_{(j)} = \begin{pmatrix} \hat{c}_2 e^{i\varphi_{12}^{(j)}} \\ \hat{c}_3 e^{i\varphi_{13}^{(j)}} \end{pmatrix} e^{i\omega^{(j)}t}$$

In one illustrative example, the phi-bits j=A and j=B of are considered. The nonlinear frequencies of phi-bits A and B are $5f_1-2f_2$ and $4f_1-2f_2$, respectively with $f_1=62$ kHz and $f_2=70$ kHz$-\Delta v$ with $\Delta v$ varying in increments of 50 Hz until the driving frequency $f_2$ reaches 62 kHz. $\Delta v$ serves therefore as a parameter to tune the state of the phi-bits. The state of the two logical phi-bits A and B can be redefined in terms of phase only, for example by constructing the normalized state vectors:

$$\psi^{(A)} = \frac{1}{\sqrt{2}}\begin{pmatrix} e^{i\varphi_{12}^{(A)}} \\ e^{i\varphi_{13}^{(A)}} \end{pmatrix} \text{ and } \psi^{(B)} = \frac{1}{\sqrt{2}}\begin{pmatrix} e^{i\varphi_{12}^{(B)}} \\ e^{i\varphi_{13}^{(B)}} \end{pmatrix} \qquad \text{Eq. (4)}$$

The state vectors of Eq. (4) reside in single phi-bit 2D Hilbert space, with basis $$\left\{ \begin{pmatrix} 1 \\ 0 \end{pmatrix}, \begin{pmatrix} 0 \\ 1 \end{pmatrix} \right\}.$$

The quantities $e^{i\varphi_{12}^{(j)}}$ and $e^{i\varphi_{13}^{(j)}}$, j=A, B, represent the complex coefficient in a linear combination of the 2D basis vectors. A state vector can now be constructed for a composite system composed of the two phi-bits. This state vector can be represented as the tensor product:

$$\psi^{(AB)} = \psi^{(A)} \otimes \psi^{(B)} = \frac{1}{2}\begin{pmatrix} e^{i\varphi_{12}^{(A)}} e^{i\varphi_{12}^{(B)}} \\ e^{i\varphi_{12}^{(A)}} e^{i\varphi_{13}^{(B)}} \\ e^{i\varphi_{13}^{(A)}} e^{i\varphi_{12}^{(B)}} \\ e^{i\varphi_{13}^{(A)}} e^{i\varphi_{13}^{(B)}} \end{pmatrix} \qquad \text{Eq. (5)}$$

The state vector of Eq. (5) resides in the 4D Hilbert space, tensor product of two 2D single phi-bit Hilbert spaces. The basis of that 4D space is composed of the tensor products of the basis vectors of the 2D spaces. New representations of the A, B phi-bit system can then be defined by applying a unitary transformation. Consider the following block diagonal unitary matrix:

$$\ddot{T} = \frac{1}{\sqrt{2}}\begin{pmatrix} e^{-i\varphi_{12}^{(A)}} & e^{-i\varphi_{13}^{(B)}} & 0 & 0 \\ -e^{-i\varphi_{12}^{(A)}} & e^{-i\varphi_{13}^{(B)}} & 0 & 0 \\ 0 & 0 & e^{-i\varphi_{13}^{(A)}} & e^{-i\varphi_{12}^{(B)}} \\ 0 & 0 & e^{-i\varphi_{13}^{(A)}} & -e^{-i\varphi_{12}^{(B)}} \end{pmatrix} \qquad \text{Eq. (6)}$$

Application of this transformation to $\psi^{(AB)}$ $|\psi^{(AB)}$ leads to the normalized state vector:

$$\ddot{T}\psi^{(AB)} = \Phi^{(AB)} = \frac{1}{2\sqrt{2}}\begin{pmatrix} e^{i\varphi_{12}^{(A)}} + e^{i\varphi_{12}^{(B)}} \\ e^{i\varphi_{12}^{(A)}} - e^{i\varphi_{12}^{(B)}} \\ e^{i\varphi_{13}^{(A)}} + e^{i\varphi_{13}^{(B)}} \\ e^{i\varphi_{13}^{(A)}} - e^{i\varphi_{13}^{(B)}} \end{pmatrix} \qquad \text{Eq. (7)}$$

Figure 3A:
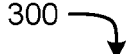
FIG. 3A is a graph depicting phases $\varphi_{12}$ (open circles) and $\varphi_{13}$ (closed circles) measured for phi-bits A and B as functions of $f_2=70$ kHz$-\Delta v$ where $\Delta v$ is a frequency tuning parameter.
Figure 3A:
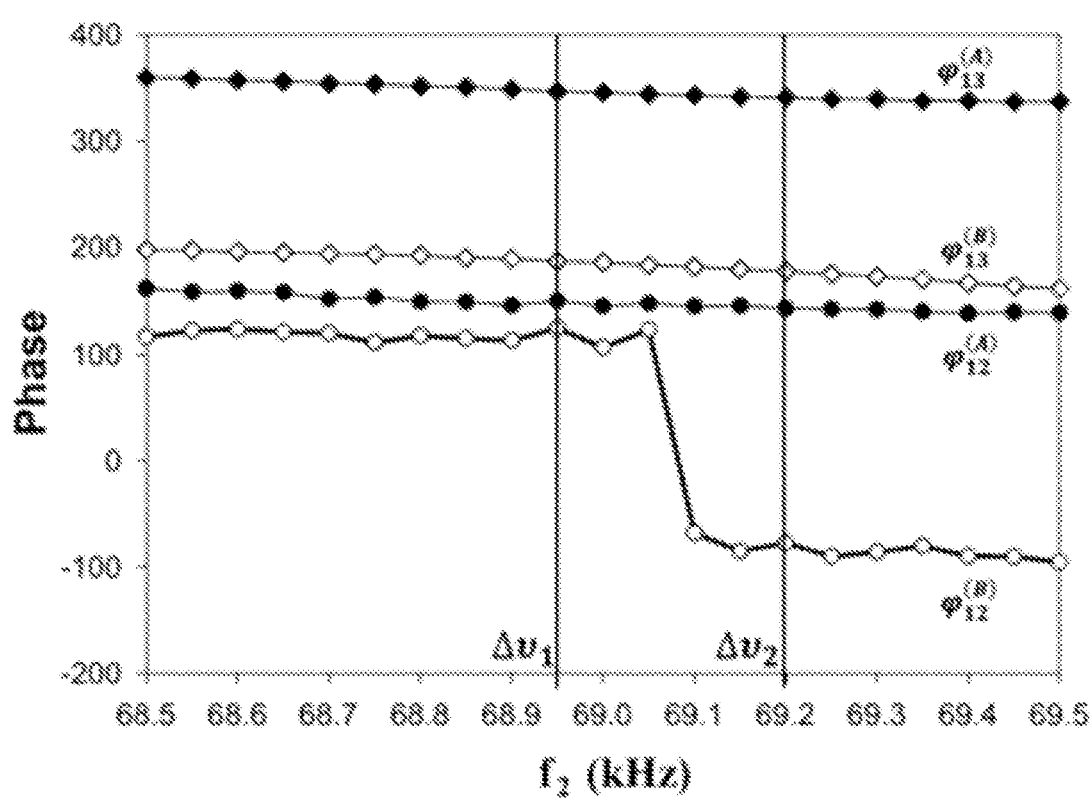
Figures 3B, 3C:
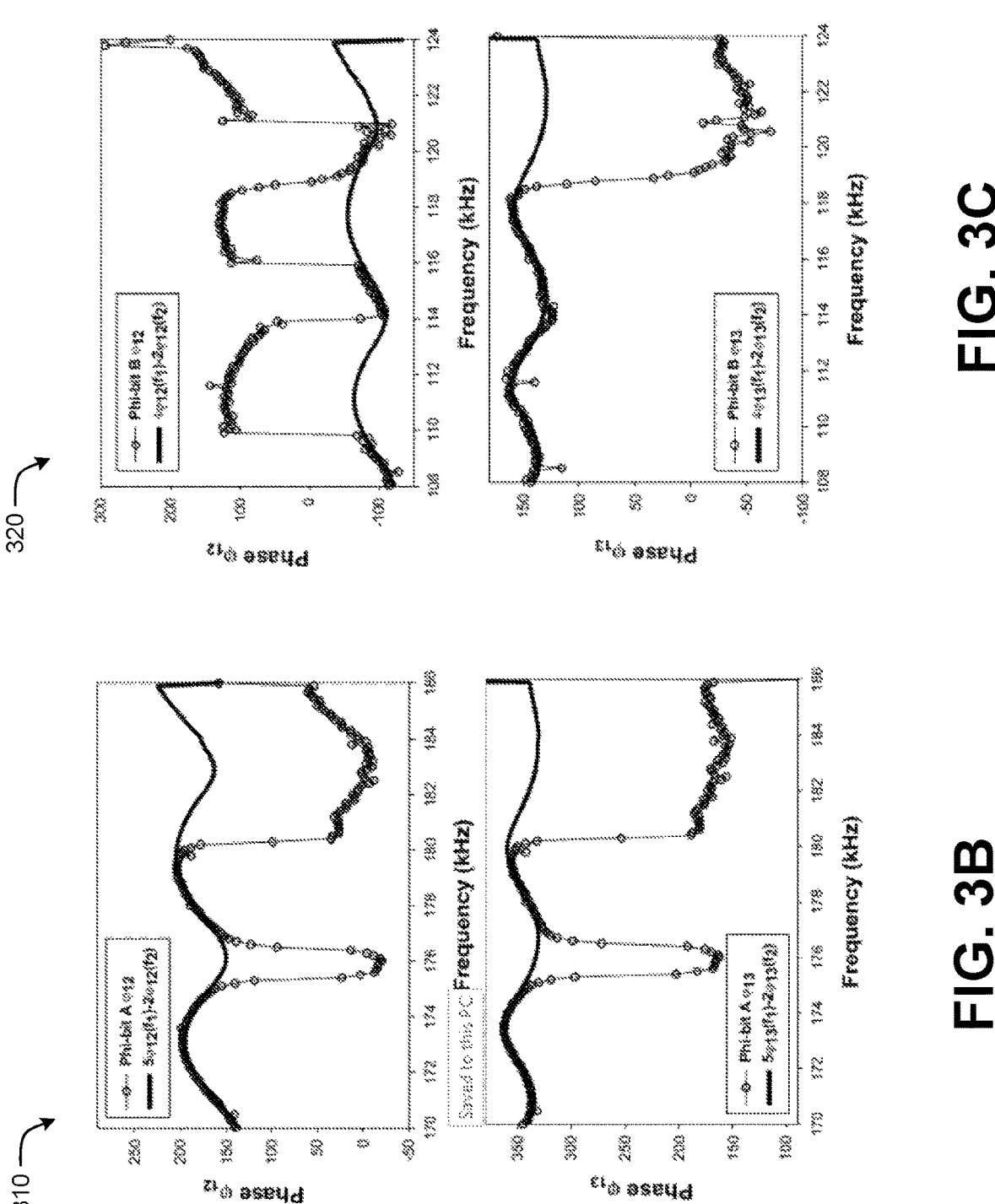
FIG. 3B is a graph depicting the phases $\varphi_{12}$ (open circles) and $\varphi_{13}$ (closed circles) measured for the phi-bit A defined by the mixed frequency $5f_1-2f_2$ with $f_1=62$ kHz and the second driving frequency $f_2$ varied in the interval [70–62 kHz] by decreasing increments of 50 Hz.
FIG. 3C is a graph depicting the phases $\varphi_{12}$ (open circles) and $\varphi_{13}$ (closed circles) measured for the phi-bit B defined by the mixed frequency $4f_1-2f_2$ with $f_1=62$ kHz and the second driving frequency $f_2$ varied in the interval [70–62 kHz] by decreasing increments of 50 Hz.

$\ddot{T}$ is one out of an infinite number of unitary transformations that produce different representations of the state of the A, B composite system. In some aspects, $\Phi^{(AB)}$ can be seen to vary as a function of a frequency tuning parameter, $\Delta\upsilon$. For example, FIG. 3A is a graph 300 plotting the phases $\varphi_{12}^{(A)}(\Delta\upsilon)$, $\varphi_{13}^{(A)}(\Delta\upsilon)$, $\varphi_{12}^{(B)}(\Delta\upsilon)$ and $\varphi_{13}^{(B)}(\Delta\upsilon)$ (e.g., which are depicted in the graphs 310 and 320 of FIGS. 3B and 3C, respectively) over a narrow range of Au that encompasses a single $\pi$ jump in $\varphi_{12}^{(B)}$. Recall that these phases of logical phi-bits are nonlinearly correlated as they depend on the same external driving conditions. This corresponds to regions of absolute frequencies seen in the graph 310 of FIG. 3B (plotting phase and frequency information for phi-bit A) and the graph 320 of FIG. 3C (plotting phase and frequency information for phi-bit B). In particular, the regions of absolute frequencies are centered on 172 kHz for phi-bit A (in graph 310 of FIG. 3B) and are centered on 110 kHz for phi-bit B (in graph 320 of FIG. 3C).

Consider a change of frequency tuning parameter from $\Delta\upsilon_2$ to $\Delta\upsilon_1$, which leads to very small changes in $\varphi_{12}^{(A)}$, $\varphi_{13}^{(A)}$, and $\varphi_{13}^{(B)}$. In contrast $\varphi_{12}^{(B)}$ undergoes a $\pi$ jump. The state vector $\Phi^{(AB)}$ transforms approximately as $$\frac{1}{2\sqrt{2}}\begin{pmatrix} e^{i\varphi_{12}^{(A)}} + e^{i\varphi_{12}^{(B)}} \\ e^{i\varphi_{12}^{(A)}} - e^{i\varphi_{12}^{(B)}} \\ e^{i\varphi_{13}^{(A)}} + e^{i\varphi_{13}^{(B)}} \\ e^{i\varphi_{13}^{(A)}} - e^{i\varphi_{13}^{(B)}} \end{pmatrix} \rightarrow \frac{1}{2\sqrt{2}}\begin{pmatrix} e^{i\varphi_{12}^{(A)}} + e^{i\varphi_{12}^{(B)}} \\ e^{i\varphi_{12}^{(A)}} - e^{i\varphi_{12}^{(B)}} \\ e^{i\varphi_{13}^{(A)}} + e^{i\varphi_{13}^{(B)}} \\ e^{i\varphi_{13}^{(A)}} - e^{i\varphi_{13}^{(B)}} \end{pmatrix} \qquad \text{Eq. (8)}$$

Here the first two complex amplitudes are permuted by the effect of adding $\pi$ to $\varphi_{12}^{(B)}$ and keeping all other phase constants. This is the action of the controlled-NOT gate that can be represented by the matrix $$\begin{pmatrix} 0 & 1 & 0 & 0 \\ 1 & 0 & 0 & 0 \\ 0 & 0 & 1 & 0 \\ 0 & 0 & 0 & 1 \end{pmatrix}$$

(e.g., such as the C-NOT gate described above that can be represented by the matrix of Eq. (3)).

Note that this matrix has operated on complex amplitude coefficients. By choosing the interval $[\Delta\upsilon_2, \Delta\upsilon_1]$ to encompass an eventual hysteresis, this gate operation is reversible. This is but one example of how to realize quantum-like logic gates using logical phi-bits.

The generalization of the notion of representations of multiple (N>2) correlated phi-bits as $2^N$ dimensional vector states and the exploitation of the background phases as well as nonlinear phase jumps as functions of the frequency tuning parameter can enable operations in exponentially complex Hilbert spaces, as will be described in further detail in the sections below.

IV. Acoustic Quantum-Like Gates: Single Logical Phi-Bit Gates

Specific and universal operations on examples of logical phi-bit systems are described below and experimentally validated. Experimental validation can be performed based on a same or similar experimental setup as described previously above, for example using a physical metamaterial comprising an array of three elastically coupled acoustic waveguides that produces a nonlinear displacement field which can be partitioned in the frequency domain. Each waveguide can be provided as a finite length aluminum rod with circular cross section. The rods are arranged in a linear array with a lateral gap filled with epoxy. Ultrasonic transducers drive and detect the acoustic field at the ends of the rods. Function generators and amplifiers are used to excite two driving transducers attached to the ends of guide 1 and 2 with sinusoidal signals of same magnitude but with frequency $f_1$=62 kHz, $f_2$=66 kHz. These frequencies were selected for illustrative purposes and it is noted other driving frequencies may also be utilized. Experiments conducted with other frequencies can be seen to show qualitatively similar behavior. The driving frequency of the first rod is modified according to $f_1$=62 kHz$-\Delta\upsilon$ where the tuning parameter $\Delta\upsilon$ is used to navigate the logical phi-bits Hilbert space. Three detecting transducers located at the opposite ends of the rods collect data on the displacement field. The nonlinearity of this driven system leads to various ways of mixing the drivers' frequencies. The measured displacement field at the detection end of the waveguides is the Fourier sum of a large number of linear and nonlinear modes, each with its own characteristic frequency. That is, each one of these nonlinear modes appearing as peaks in the Fourier spectrum of the displacement field is effectively a logical phi-bit. In one illustrative example of experimental validation, an oscilloscope can record the driving and response signals, which are averaged over 128 time series. Over multiple sets of independent experimental measurements, it is found that the phase had an estimated experimental uncertainty of less than $\pi/9$. In addition, because the force transducers are not bonded to the sample, the layer of couplant on the sample's edges was kept constant throughout the experiments by maintaining a constant pressure on the transducers.

Hadamard Gate Operations on a Single Logical Phi-Bit

Described below is a single phi-bit (e.g., nonlinear mode) in the Fourier spectrum of the displacement field (e.g., acoustic field) with frequency $f_1-\Delta f$ with $\Delta f=|f_2-f_1|$ (i.e. $2f_1-f_2$). The phases $\varphi_{12}$ and $\varphi_{13}$ as functions of tuning parameter $\Delta\upsilon\in[0,4000]$ Hz in increments of 10 Hz are depicted in the graph 400a of FIG. 4.

The 2×1 vector representation of the phi-bit amplitude can be modified to another representation defined as $$\vec{U}' = \begin{pmatrix} \cos\Delta_\varphi \\ \sin\Delta_\varphi \end{pmatrix} = \begin{pmatrix} \cos S[(\varphi_{12} - \varphi_{12}^0) - (\varphi_{13} - \varphi_{13}^0)] \\ \sin S[(\varphi_{12} - \varphi_{12}^0) - (\varphi_{13} - \varphi_{13}^0)] \end{pmatrix}$$

where $\varphi_{12}^0 = \varphi_{12}$ ($\Delta\upsilon$=0) and $\varphi_{13}^0 = \varphi_{13}$ ($\Delta\upsilon$=0) and the factor S scales the phase difference to 2 nL. This representation limits the components of $\vec{U}'$ to real number. The components of this amplitude vector as a function of tuning parameter are presented in the graph 400b of FIG. 4.

Figure 4:
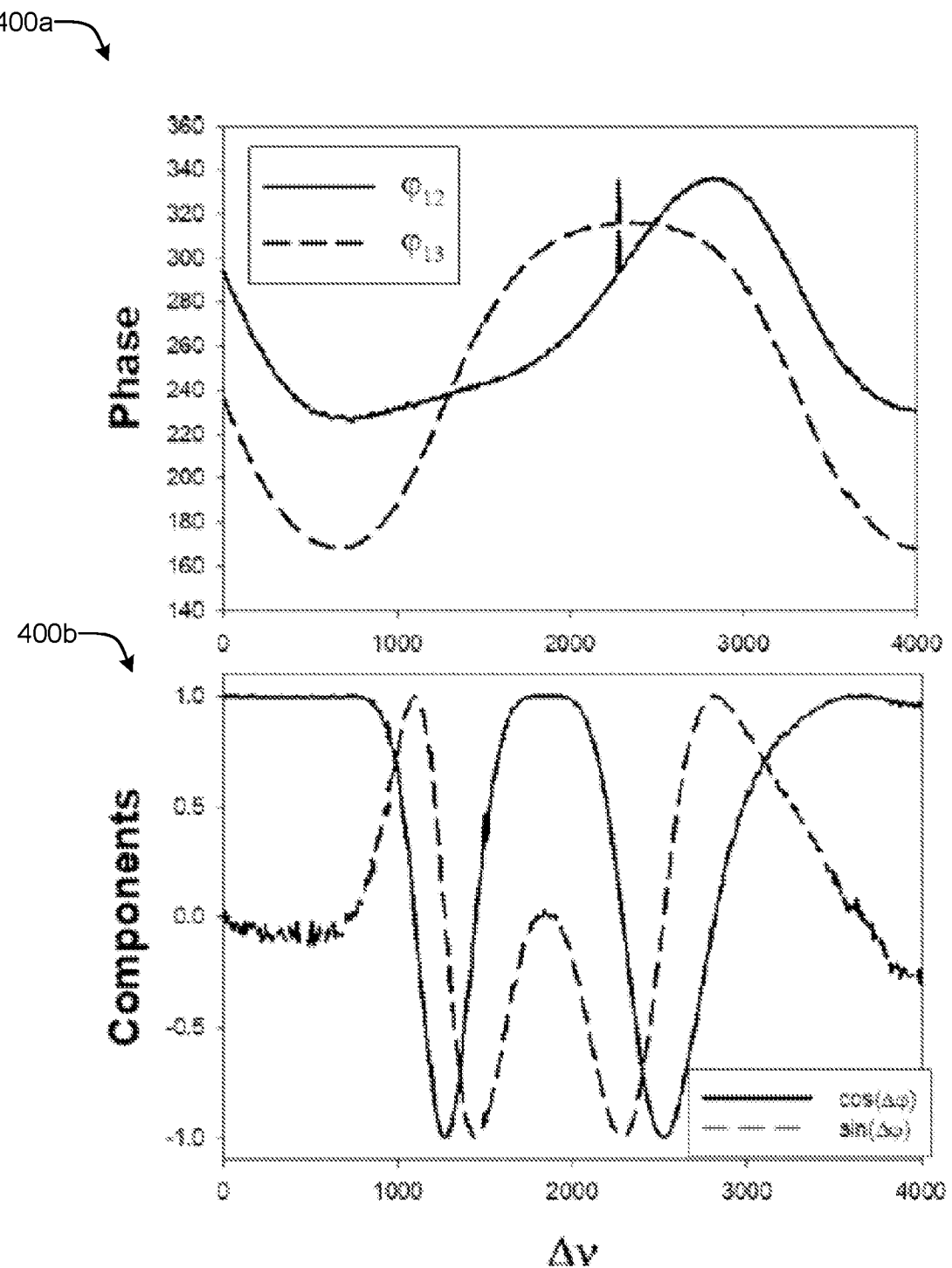
FIG. 4 is a graph depicting a phi-bit with frequency $2f_1-f_2$, with phases $\varphi_{12}$ and $\varphi_{13}$ given as functions of a driving frequency tuning parameter $\Delta v$ and components of the $\vec{U}'$ representation of the phi-bit given as a function of the same driving frequency tuning parameter $\Delta v$.
Figure 5:
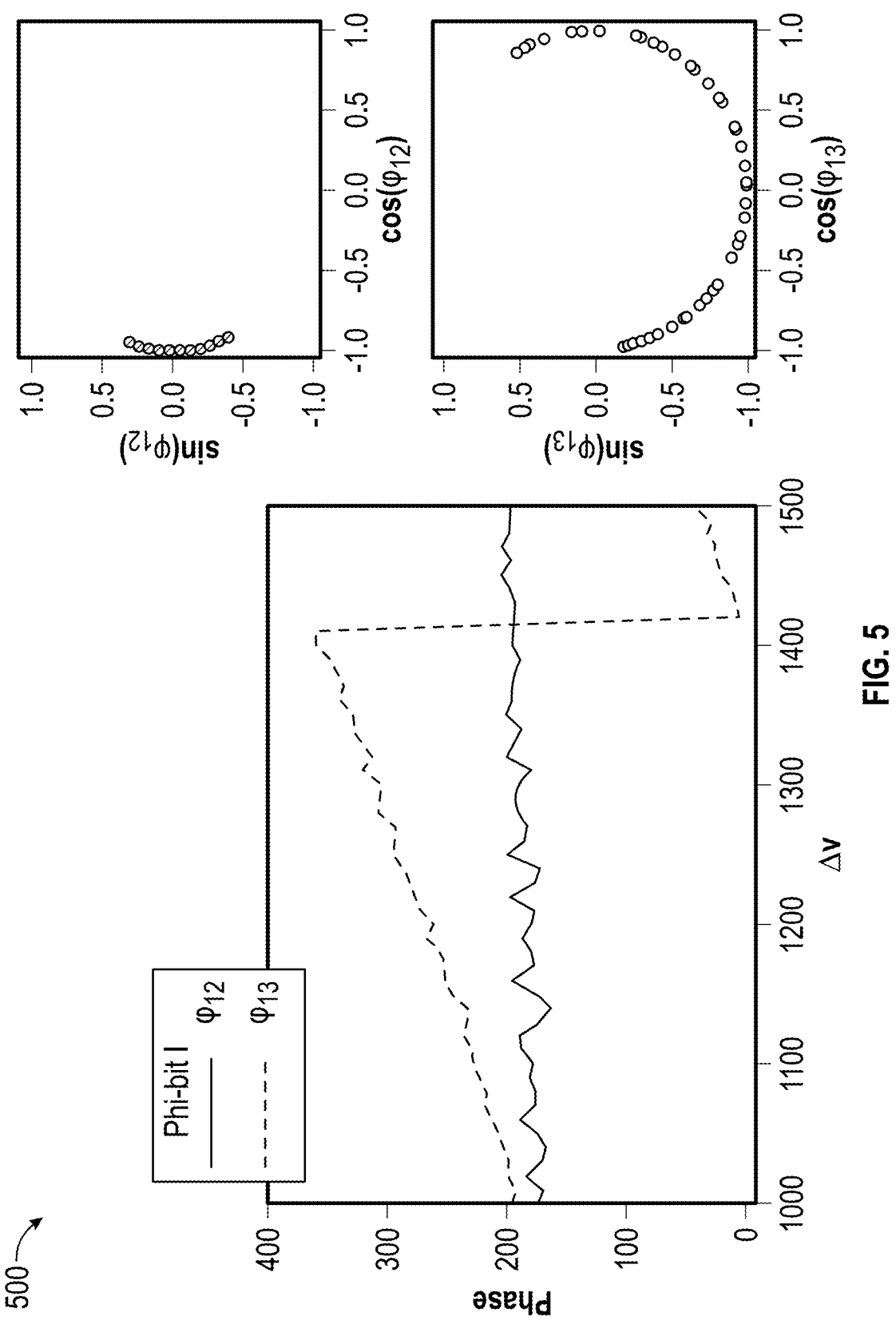
FIG. 5 is a graph depicting a phi-bit I with frequency $f_1-4\Delta f$.
Figure 6:
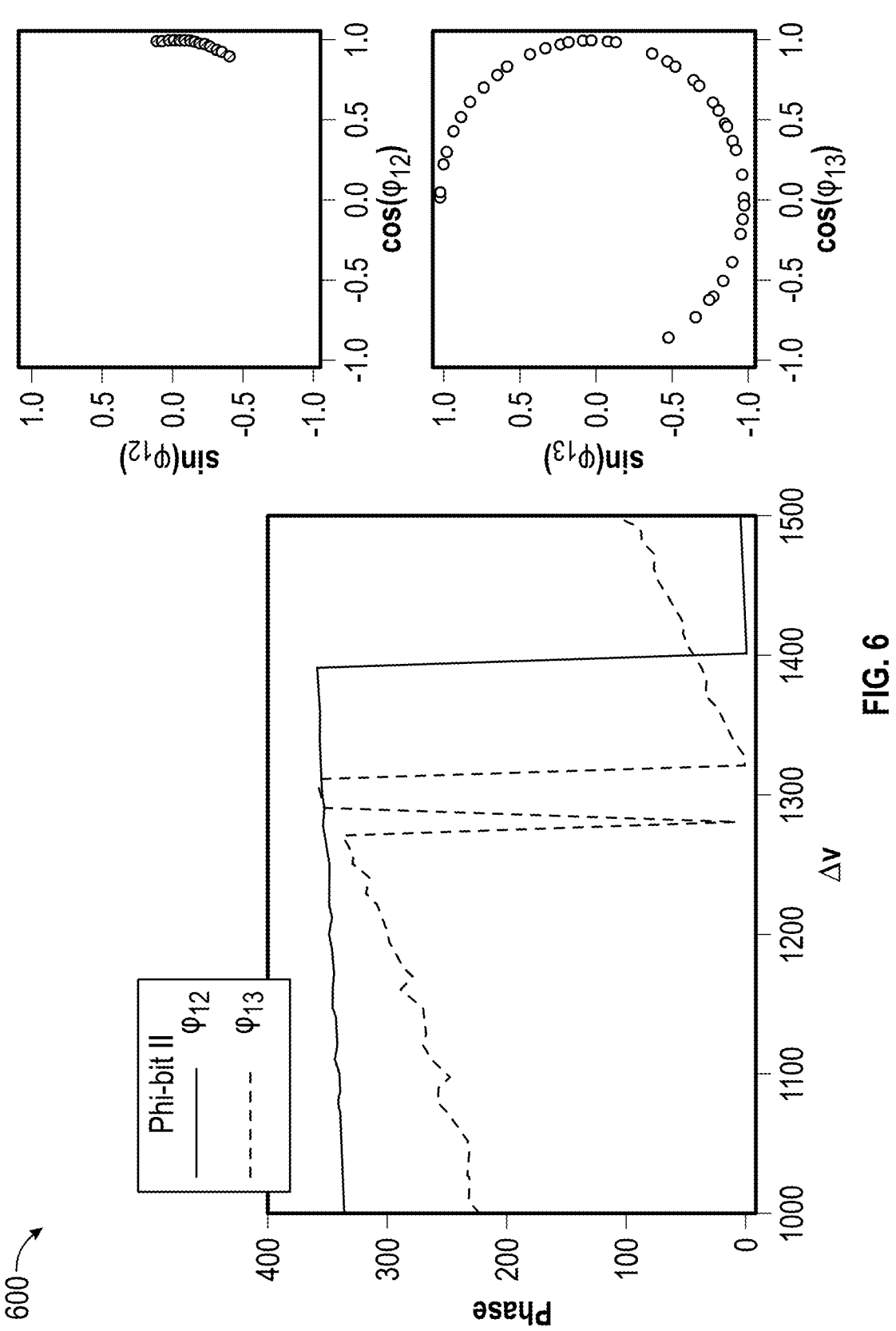
FIG. 6 is a graph depicting a phi-bit II with frequency $2f_1+f_2-4\Delta f$.
Figure 7:
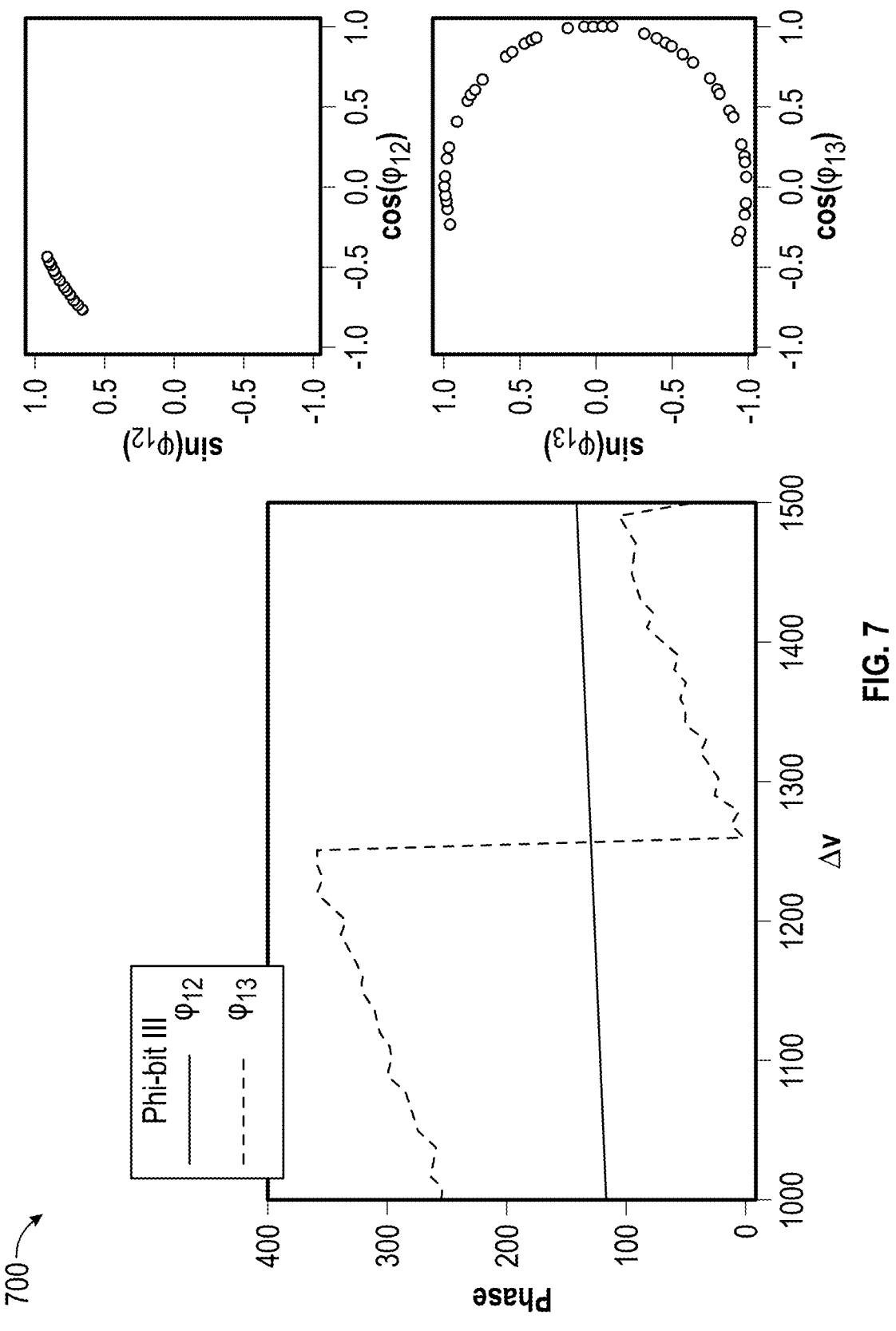
FIG. 7 is a graph depicting a phi-bit III with frequency $2f_1+f_2-3\Delta f$.
Figure 8:
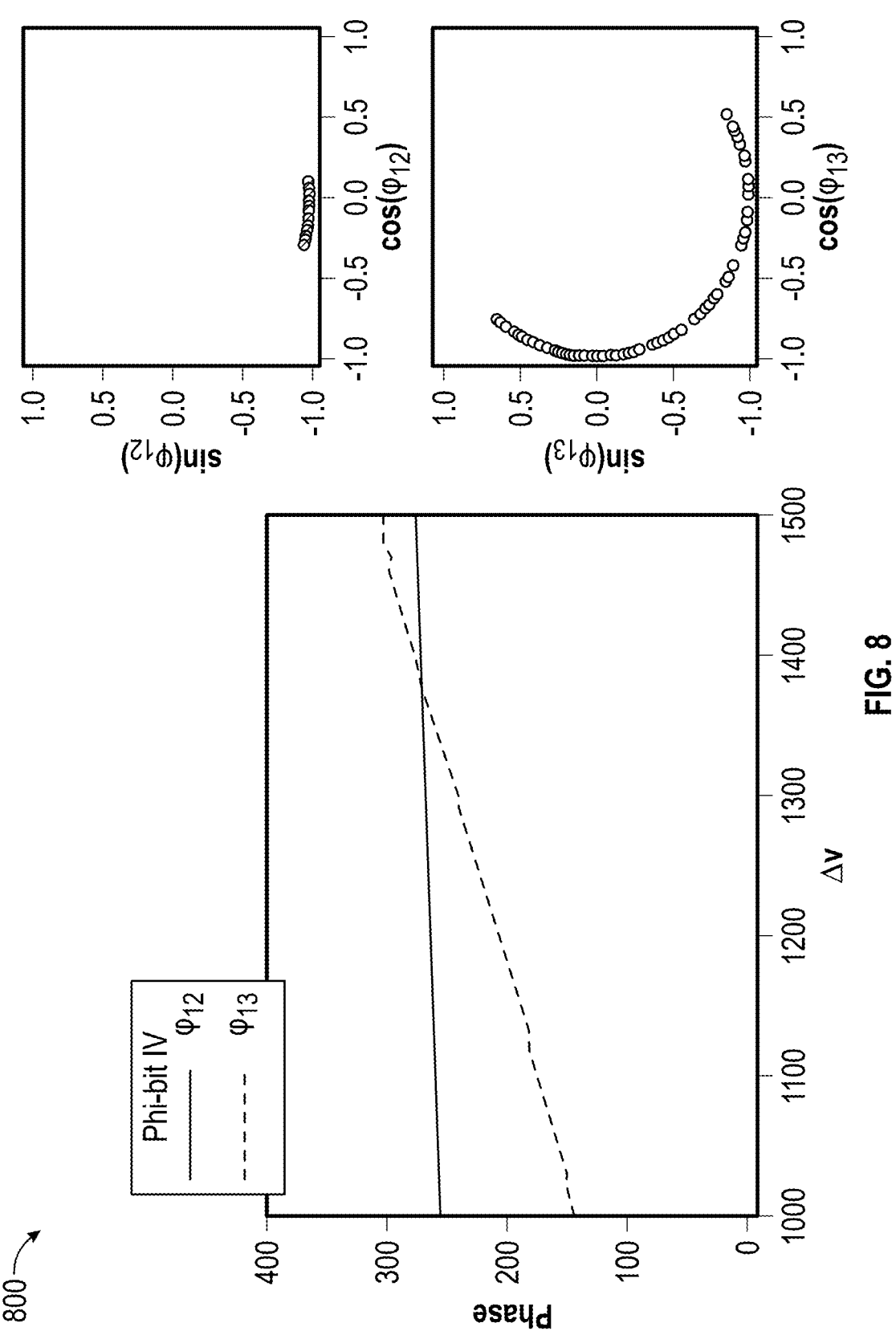
FIG. 8 is a graph depicting a phi-bit IV with frequency $2f_1+f_2-2\Delta f$.

In particular, graph 400b of FIG. 4 illustrates that the two components of $\vec{U}'$ vary simultaneously and coherently with the tuning parameter. Graph 400b also shows that with a proper choice of the tuning parameter, the systems and techniques described herein can be used to realize a number of pure states and/or superpositions of states and relate them through a unitary transformation similar to the Hadamard gate matrix:

$$H_a = \frac{1}{\sqrt{2}}\begin{pmatrix} 1 & 1 \\ 1 & -1 \end{pmatrix}.$$

Various examples of these states with their associated value of the tuning parameter are described below in Table 1.

TABLE 1

Examples of values of the tuning parameter $\Delta v$ realizing $\vec{U}$' states with real components related to within a general phase of 0 or $\pi$ by the Hadamard gate, $H_a$.

| $\Delta v$ (Hz) | 780 | 980 | 1100 | 1300 |
|---|---|---|---|---|
| State | $\begin{pmatrix} 1 \\ 0 \end{pmatrix}$ | $\begin{pmatrix} 1 \\ 1 \end{pmatrix}$ | $\begin{pmatrix} 0 \\ 1 \end{pmatrix}$ | $\begin{pmatrix} 1 \\ -1 \end{pmatrix}$ |
| Operation | $H_a \equiv \delta(\Delta v) = 200$ Hz | | $H_a \equiv \delta(\Delta v) = 200$ Hz | |

Note
that the states in this table may not be normalized.

In some embodiments, the Hadamard gate operation that takes a pure state $$\begin{pmatrix} 1 \\ 0 \end{pmatrix} \text{ or } \begin{pmatrix} 0 \\ 1 \end{pmatrix}$$

into the coherent super-positions of states $$\begin{pmatrix} 1 \\ 1 \end{pmatrix} \text{ or } \begin{pmatrix} 1 \\ -1 \end{pmatrix}$$

can then be implemented by applying physically a systematic and predictable change of 200 Hz in the value of the tuning parameter. In some aspects, the Hadamard gate described herein can be seen to illustrate the potential of logical phi-bits for quantum analogue computing. Representations of phi-bit states with complex coefficients and the capability to manipulate the relative phase between these coefficients is described in the next subsection.

Phase Gates

The phase shift gate or phase gate is a single logical phi-bit gate that keeps one component of a phi-bit representation constant and phase shifts the other component of the phi-bit representation. The gate matrix representation can be given as $$P(\varphi) = \begin{pmatrix} 1 & 0 \\ 0 & e^{i\varphi} \end{pmatrix},$$

where $\varphi$ is the phase shift, and may be considered an essential operation in quantum Fourier transforms. Described below is a representation of logical phi-bit states in the form:

$$\vec{U}'' = \begin{pmatrix} e^{i\varphi_{12}} \\ e^{i\varphi_{13}} \end{pmatrix}.$$

Also described are four different phi-bits corresponding to nonlinear modes in the metamaterial Fourier spectrum with the frequencies: (phi-bit I) $f_1-4\Delta f$, (phi-bit II) $2f_1+f_2-4\Delta f$, (phi-bit III) $2f_1+f_2-3\Delta f$, and phi-bit IV) $2f_1+f_2-2\Delta f$.

FIGS. 5-8 are graphs (500-800, respectively) depicting the variation in phases $\varphi_{12}$ and $\varphi_{13}$ for the four phi-bits over the same range of tuning parameter. In all cases, $\varphi_{12}(\Delta v)$ varies only slightly compared to $\varphi_{13}(\Delta v)$. The components $e^{i\varphi_{12}}$ and $e^{i\varphi_{13}}$ are plotted in the complex plane with states represented on the unit circle. The four phi-bits can be seen to provide a good approximation of the complete set of superpositions of states:

$$\begin{pmatrix} -1 \\ e^{i\varphi_{13}(I)} \end{pmatrix}, \begin{pmatrix} 1 \\ e^{i\varphi_{13}(II)} \end{pmatrix}, \begin{pmatrix} i \\ e^{i\varphi_{13}(III)} \end{pmatrix}, \begin{pmatrix} -i \\ e^{i\varphi_{13}(IV)} \end{pmatrix}.$$

Note that the phi-bit state components are now complex quantities. By changing the tuning parameter, the first component remains constant to within a well-characterized interval while the second component varies over a sizeable section of the unit circle. The complex plane can be completely spanned by the second component if another representation of the phi-bit states taking the form $$\begin{pmatrix} e^{i\varphi_{12}} \\ e^{im\varphi_{13}} \end{pmatrix}$$

is used, where m is a coefficient introduced to rescale the phase $\varphi_{13}$.

In one illustrative example, it is contemplated that the presently disclosed phase gate can then be applied physically by varying $\Delta v$.

Example Algorithm with Three Phi-Bits

Figure 9:
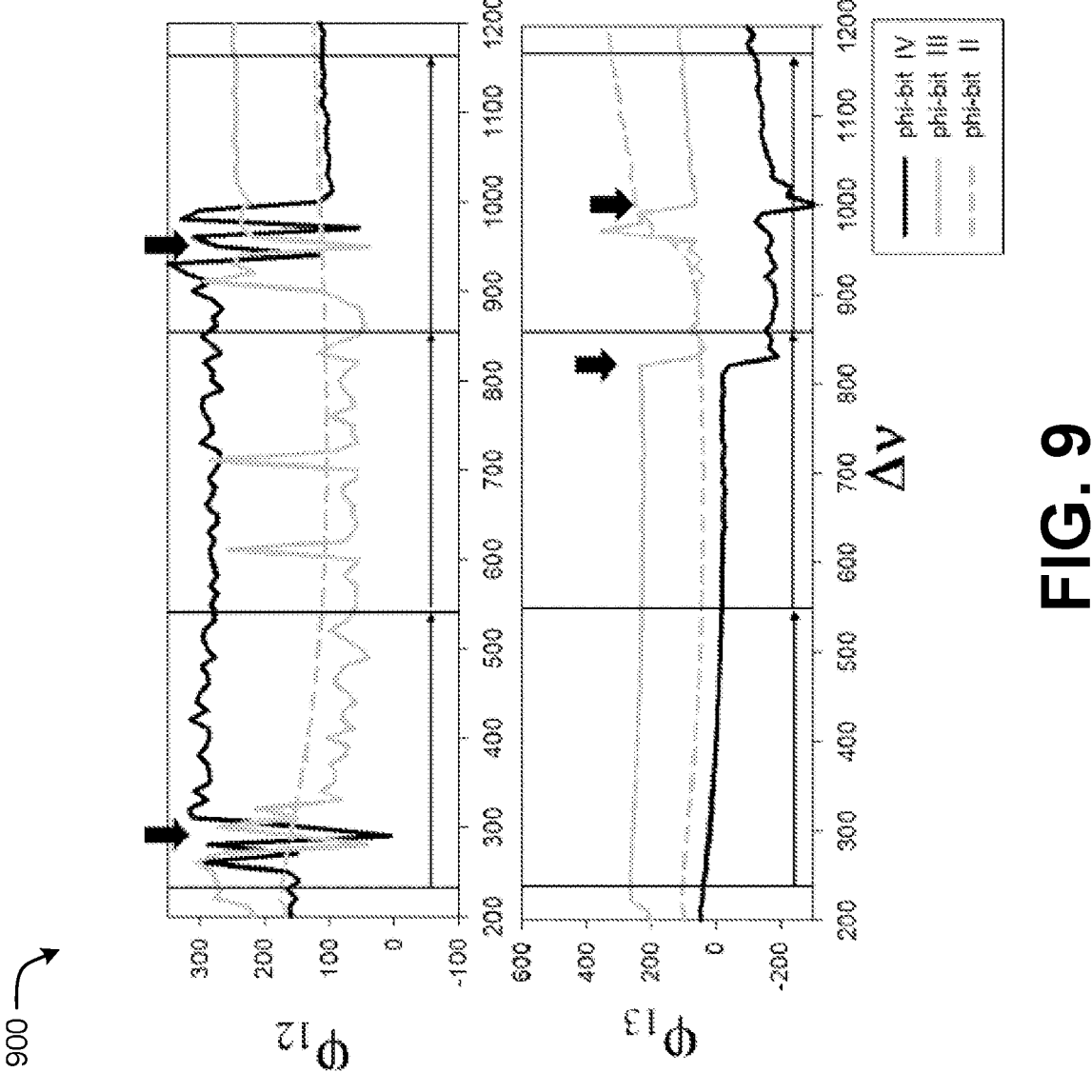
FIG. 9 is a graph depicting the phases $\varphi_{12}$ and $\varphi_{13}$ of phi-bits II, III, and IV as functions of the driving frequency tuning parameter $\Delta v$ over the range 200-1200 Hz, with the locations of $\pi$ jumps in the phases further depicted.

Described above are implementations of logical phi-bits and ranges of the associated tuning parameter $\Delta v$ that were associated with monotonous variations in the phases $\varphi_{12}$ and $\varphi_{13}$. The complex amplitudes of phi-bit states are composed of products of resonant amplitudes. FIG. 9 depicts a graph 900 illustrating $\pi$ jumps in the phases associated with such resonant processes for phi-bits II, III, and IV.

These resonances can be used to develop additional operations on phi-bits states via variations in $\Delta v$. The system of three phi-bits II, III, and IV can be treated as partitioned into a two phi-bit (III and IV) composite system and another reference phi-bit (II). The state of the two phi-bit composite evolves now in a $2^2$-dimensional Hilbert space while the state of the remaining phi-bit spans a two-dimensional space. A two phi-bit representation can be employed, given by:

$$\vec{U}(III-IV) = \begin{pmatrix} 1 + e^{i(\varphi^*_{12}(III)+\varphi^*_{12}(IV))} \\ 1 + e^{i(\varphi^*_{12}(III)+\varphi^*_{13}(IV))} \\ 1 + e^{i(\varphi^*_{13}(III)+\varphi^*_{12}(IV))} \\ 1 + e^{i(\varphi^*_{13}(III)+\varphi^*_{13}(IV))} \end{pmatrix} \quad \text{Eq. (9)}$$

Figure 10:
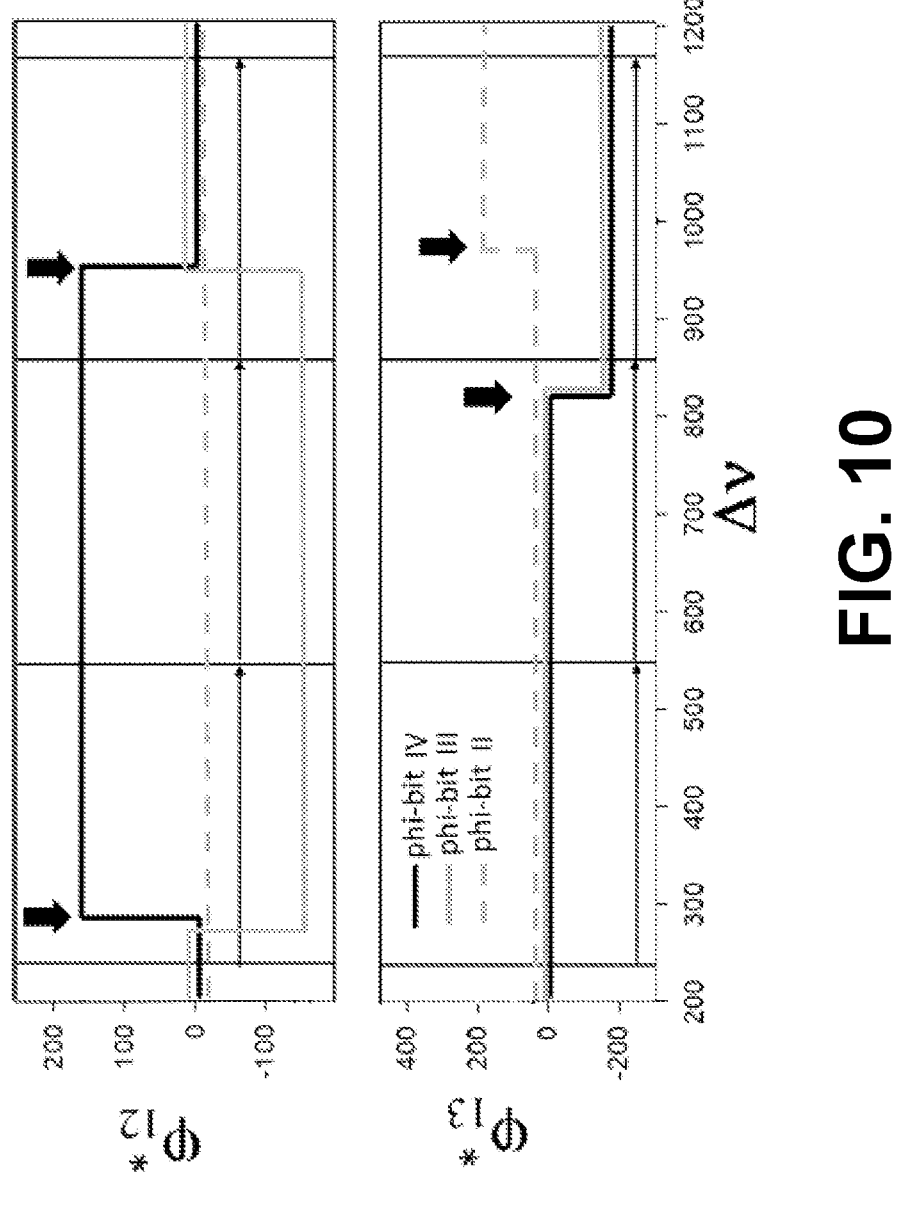
FIG. 10 is a graph depicting the phases $\varphi^*_{12}$ and $\varphi^*_{13}$ of phi-bits II, III, and IV as functions of the driving frequency tuning parameter $\Delta v$ over the range 200-1200 Hz and adjusted to include only resonant variations with the tuning parameter, with the locations of π jumps in the phases further depicted.

Since the phases $\varphi_{12}$ and $\varphi_{13}$ exhibit monotonous variations as well as resonant $\pi$ jumps, in Eq. (9), the phases $\varphi^*_{12}$ and $\varphi^*_{13}$ are stripped from the monotonous variations and include only the resonant changes. Furthermore, all phases are translated to the origin at $\Delta v=200$ Hz. The graph 1000 of FIG. 10 illustrates schematically this adjustment. In this representation, the states of the III-IV composite are given in Table 2, below:

TABLE 2

States of the two phi-bit III-IV composite system and the values of their corresponding tuning parameter.

| $\Delta v$ (Hz) | 230 | 545 | 860 | 1175 |
|---|---|---|---|---|
| State | $\begin{pmatrix} 1 \\ 1 \\ 1 \\ 1 \end{pmatrix}$ | $\begin{pmatrix} 1 \\ 0 \\ 0 \\ 1 \end{pmatrix}$ | $\begin{pmatrix} 1 \\ 1 \\ 1 \\ 1 \end{pmatrix}$ | $\begin{pmatrix} 1 \\ 0 \\ 0 \\ 1 \end{pmatrix}$ |

Note that the states in this table are to be normalized by $\frac{1}{2}$ for the first and third states and $\frac{1}{\sqrt{2}}$ for the second and fourth states.

Starting with a tuning parameter at $\Delta v = 230$ Hz, the two phi-bit state alternates between $$\begin{pmatrix} 1 \\ 1 \\ 1 \\ 1 \end{pmatrix} \text{ and } \begin{pmatrix} 1 \\ 0 \\ 0 \\ 1 \end{pmatrix}$$

for every increment of the tuning parameter of 315 Hz. Effectively the four-dimensional state vector follows a closed loops in the Hilbert space of the two phi-bit composite system. Note that the identical first and third states are separable into a tensor product of two individual phi-bit states, while the second and fourth states are non-separable. The matrix associated with the unitary operation that corresponds to the physical action of incrementing the tuning parameter is:

$$Q = \frac{1}{\sqrt{2}} \begin{pmatrix} 1 & 1 & 0 & 0 \\ 1 & -1 & 0 & 0 \\ 0 & 0 & -1 & 1 \\ 0 & 0 & 1 & 1 \end{pmatrix} \qquad \text{Eq. (10)}$$

Note that this unitary transformation can be written as the combination of one or more of the more fundamental quantum gates: $Q = -\sigma_z \otimes \sigma_z + \sigma_x \otimes I$, where $\sigma_x$, $\sigma_z$ and I are 2×2 Pauli gates and the identity matrix, respectively. This transformation can be used to develop algorithms. For example, consider going from a state $$\begin{pmatrix} 1 \\ 0 \\ 0 \\ 1 \end{pmatrix}$$

starting at $\Delta v = 545$ Hz to another identical state $$\begin{pmatrix} 1 \\ 0 \\ 0 \\ 1 \end{pmatrix}$$

by two routes.

The first route is to apply an operation associated with the 4×4 identity matrix whereby the value of $\Delta v$ is unchanged. The second route is to apply the matrix operation Q twice, that is, to change $\Delta v$ by adding 2×230 Hz. In the first case, the phi-bit II does not change its state. For instance, using the representation $$\vec{U}(II) = \begin{pmatrix} 1 + e^{i\varphi_{12}^*(II)} \\ 1 + e^{i\varphi_{13}^*(II)} \end{pmatrix},$$

phi-bit II remains in the state $$\begin{pmatrix} 1 \\ 1 \end{pmatrix}.$$

However, in the case of the second route, the state of phi-bit II changes to $$\begin{pmatrix} 1 \\ 0 \end{pmatrix}$$

because one of its resonant $\pi$ jumps has been crossed. In one illustrative example, the change on phi-bit II can be measured while the state of the III-IV composite system has not effectively changed. Accordingly, this is a controlled operation. An algorithm can be used to differentiate whether a function, $f(X)$ of a single variable $X \in [1, 2, 3, 4]$ is a constant (e.g., such as 1) or is linear (e.g., such as $f(X) = X$). To do so, the matrix Q may be redefined as follows:

$$Q_f = \frac{1}{\sqrt{2}} \frac{f(4) - f(3) + f(2) + f(1)}{2} \times$$

$$\begin{pmatrix} (-1)^{1+f(1)} & \frac{1}{2}(1 + (-1)^{f(2)}) & 0 & 0 \\ \frac{1}{2}(1 + (-1)^{f(2)}) & (-1)^{1+f(2)} & \frac{1}{2}(1 + (-1)^{f(3)}) & 0 \\ 0 & \frac{1}{2}(1 + (-1)^{f(3)}) & (-1)^{1+f(4)} & \frac{1}{2}(1 + (-1)^{f(4)}) \\ 0 & 0 & \frac{1}{2}(1 + (-1)^{f(4)}) & (-1)^{1+f(3)} \end{pmatrix}$$

Here, $Q_f$ realizes the identity matrix if the function $f$ is constant and the unitary transformation Q if the function is linear. There, the character of the function can be identified in one single iteration. The algorithm has the following steps. The system of three phi-bits is initialized at $\Delta v = 545$ Hz. An oracle (e.g., an operation that is used as input to the algorithm) applies either no change in the tuning parameter if the function is constant or adds 460 Hz if the function is linear. The state of the two phi-bits III-IV does not change, but the output in the change of phase of phi-bit II can be read. Accordingly, phi-bits III and IV serve as control inputs (their state does not change) to the unitary gate $Q_f$, which alters the phase of phi-bit II. Note that phi-bit II enables the measurement of changes (or lack thereof) in the representation space of phi-bits III and IV. Advantageously, this provides access to the mathematical structure of a representation.

V. Acoustic Quantum-Like Gates: Three Phi-Bit Unitary Operations Analogous to Quantum Circuits A correspondence between the state of three correlated logical phi-bits represented in a low-dimensional linearly scaling physical space and their state representation as a complex vector in a high-dimensional, exponentially scaling Hilbert space is established. Logical phi-bits are nonlinear acoustic modes supported by an externally driven acoustic metastructure which are analogous to qubits. Described below is the experimental implementation of a nontrivial three phi-bit unitary operation analogous to a quantum circuit. The three phi-bit gate operates in parallel on the components of the three phi-bit complex state vector requiring only a single physical action on the metastructure; a very challenging task for a quantum computer.

Quantum computing harnesses the quantum mechanical phenomena of superposition and entanglement. The first phenomenon provides the support for encoding massive amounts of information in coherent superpositions of states of a composite quantum system constituted of subsystems. The second phenomenon provides the correlation between the subsystems and the capability of processing information in a parallel manner. Quantum circuits model quantum computations as sequences of quantum gates operating on quantum bits (qubits). Qubits can be thought of as the subsystems of the computer composite system. A qubit is a two-level subsystem, which superposition is expressed in the two-dimensional basis corresponding to its two available pure states. Quantum gates are unitary operators and are described as unitary matrices acting on the state of the quantum system of interest expressed in some basis. A single qubit gate operates on the qubit superposition expressed in its two-dimensional basis. A two-qubit gate operates on the superposition of states of the two qubits expressed on a $2^2=4$-dimensional basis, tensor product of the individual qubit bases. Three qubit gates operate on states expressed on a $2^3=8$-dimensional basis. A N-bit gate operates on states supported by an exponentially scaling basis of dimension $2^N$. It is this exponential scaling that potentially gives the advantage of quantum computing over classical computers. However, quantum computing faces the challenge of physically operating simultaneously on many qubit states and of maintaining the quantum correlation between qubits during these operations. Quantum circuits are therefore decomposed into sequences of single or two qubit gates that can form a universal set of gates.

The phenomenon of coherent superposition of states is not limited to quantum systems and classical waves, such as acoustic waves, can be experimentally prepared in coherent superpositions. In linear acoustics these superpositions involve bases that are related to the degrees of freedom associated with the medium supporting the waves. The dimension of the basis is therefore limited to the number of degrees of freedom of the acoustic physical system. In nonlinear acoustics, this restriction can be lifted by visualizing the state of the system as a composite of the states associated with the many, unrestricted number, of nonlinear acoustic modes. Furthermore, while entanglement is necessary for the correlation of quantum systems, nonlinear acoustic coupling provides the correlation between nonlinear acoustic modes necessary for manipulating their superpositions simultaneously. Quantum entanglement possesses two attributes, nonseparability of the wave function of a composite system into tensor product of wave functions of subsystems and nonlocality. Classical entanglement of acoustic waves is achieved when the acoustic field or corresponding wave function is not factorizable. Acoustic wave entanglement increases the number of possible states and therefore the range of information that can be encoded and subsequently processed in those states. A final difference between acoustic waves and quantum waves is that classical waves represent amplitudes and quantum waves are probability amplitudes. Therefore, classical waves do not suffer from wave function collapse of a superposition into a pure state upon a measurement. Coherent superpositions of acoustic waves are directly measurable. In contrast, determination of a quantum superposition of states necessitates a number of measurements to account for the probabilistic nature of the quantum wave function.

As noted previously, a logical phi-bit can be understood to provide a nonlinear acoustic wave classical analogue of a qubit. Described below are demonstrations that navigation among the states of three correlated phi-bits in their space of states, i.e., Hilbert space, can achieve a nontrivial unitary operation analogous to a quantum gate. A correspondence is shown between a low-dimensional linearly scaling space of physical parameters that control the coherent superposition of states of the three phi-bits in their high-dimensional, exponentially scaling Hilbert space. Furthermore, by manipulating variables and measuring them in the low-dimensional space, the systems and techniques can be used to operate via a unitary operation on the states in the high dimensional Hilbert space. This operation can be performed on a range of initial states (inputs) covering a region of the three phi-bit Hilbert space. This operation is predictable. Predictability results from the phi-bits response to parametric changes in the physical system. This three phi-bit unitary operation does not need to be decomposed in a sequence of smaller phi-bit gates. The output is measurable.

A logical phi-bit is a nonlinear acoustic mode supported by a metastructure composed of three elastically coupled finite length acoustic waveguides driven externally (e.g., as described previously above). When the waveguides are subjected to two driving forces with two different frequencies, $f_1$ and $f_2$, a nonlinear mode "j" is well characterized by a nonlinear frequency of the form: $f^{(j)}=p^{(j)}f_1+q^{(j)}f_2$, where $p^{(j)}$ and $q^{(j)}$ are integers. The corresponding acoustic displacement field at some location within the waveguide array (e.g., at one end of the guides) is fully defined by a 2×1 vector:

$$\vec{U}_j = \begin{pmatrix} \hat{C}_2 e^{i\varphi_{12}^{(j)}} \\ \hat{C}_3 e^{i\varphi_{13}^{(j)}} \end{pmatrix} e^{i\omega^{(j)}t} \qquad \text{Eq. (11)}$$

Here, the angular frequency $\omega^{(j)}=2\pi f^{(j)}$. In this form, the displacement in two of the waveguides is referred to the third one. The magnitudes $\hat{C}_2$ and $\hat{C}_3$ are the magnitudes of the displacement of the second and third waveguides normalized to that of the first waveguide. $\varphi_{12}^{(j)}=\varphi_2^{(j)}-\varphi_1^{(j)}$ and $\varphi_{13}^{(j)}=\varphi_3^{(j)}-\varphi_1^{(j)}$ are the two independent phases in waveguides 2 and 3, relative to waveguide 1. These amplitudes and phases at the waveguide ends are controllable by tuning the driving frequencies and are also measurable unambiguously. The basis on which $\vec{U}_{(j)}$ is expressed, $$\left\{ \begin{pmatrix} 1 \\ 0 \end{pmatrix}, \begin{pmatrix} 0 \\ 1 \end{pmatrix} \right\},$$

refers to the waveguides 2 and 3 of the array. The nontemporal part of the field can be redefined in the subspace of the relative phases only by the normalized vector:

$$\vec{u}_{(j)} = \frac{1}{\sqrt{2}}\left(e^{i\varphi_{12}^{(j)}}\binom{1}{0} + e^{i\varphi_{13}^{(j)}}\binom{0}{1}\right) \qquad \text{Eq. (12)}$$

Here, $\vec{u}_{(j)}$ is defined in a two-dimensional complex Hilbert space, $h_{(j)}$. Employing Dirac's ket notation to represent the basis vectors of that space, Eq. (12) reduces to:

$$\vec{u}_{(j)} = \frac{1}{\sqrt{2}}\left(e^{i\varphi_{12}^{(j)}}|0\rangle_{(j)} + e^{i\varphi_{13}^{(j)}}|1\rangle_{(j)}\right) \qquad \text{Eq. (13)}$$

A single phi-bit state, represented in this form, spans the Bloch sphere and is analogous to a quantum bit (qubit). Eq. (13) is effectively a coherent superposition of $|0\rangle_{(j)}$ and $|1\rangle_{(j)}$ states with complex amplitudes $$\frac{1}{\sqrt{2}}e^{i\varphi_{12}^{(j)}} \quad \text{and} \quad \frac{1}{\sqrt{2}}e^{i\varphi_{13}^{(j)}}.$$

Consider next the example of three logical phi-bits. These three nonlinear modes, j=1, 2, 3, result from the nonlinear mixing of the same two driving frequencies and are therefore strongly correlated. The six complex amplitudes associated with the three phi-bit individual states are dependent on the same driving frequencies. The state of a composite system constituted of the three phi-bits can be represented via a tensor product of three single phi-bit states, namely:

$$\vec{V} = \vec{u}_{(1)} \otimes \vec{u}_{(2)} \otimes \vec{u}_{(3)} \qquad \text{Eq. (14)}$$

The state of this composite resides in the $2^3=8$ dimensional space Hilbert space $H=h_{(1)} \otimes h_{(2)} \otimes (h_{(3)}$, tensor product space of individual phi-bit Hilbert spaces. $\vec{V}$ is defined on the basis $\{|0\rangle_{(1)}|0\rangle_{(2)}|0\rangle_{(3)}, |0\rangle_{(1)}|0\rangle_{(2)}|1\rangle_{(3)}, \ldots, |1\rangle_{(1)}|1\rangle_{(2)}|1\rangle_{(3)}\}$, commonly written as $\{|000\rangle, |001\rangle, \ldots, |111\rangle\}$. In writing these basis vectors, the tensor product symbols have been dropped for notation simplicity. The state vector V can therefore be defined as an 8×1 vector:

$$\vec{V} = \begin{pmatrix} e^{i\left(\varphi_{12}^{(1)}+\varphi_{12}^{(2)}+\varphi_{12}^{(3)}\right)} \\ e^{i\left(\varphi_{12}^{(1)}+\varphi_{12}^{(2)}+\varphi_{13}^{(3)}\right)} \\ e^{i\left(\varphi_{12}^{(1)}+\varphi_{13}^{(2)}+\varphi_{12}^{(3)}\right)} \\ e^{i\left(\varphi_{13}^{(1)}+\varphi_{12}^{(2)}+\varphi_{12}^{(3)}\right)} \\ e^{i\left(\varphi_{12}^{(1)}+\varphi_{13}^{(2)}+\varphi_{13}^{(3)}\right)} \\ e^{i\left(\varphi_{13}^{(1)}+\varphi_{12}^{(2)}+\varphi_{13}^{(3)}\right)} \\ e^{i\left(\varphi_{13}^{(1)}+\varphi_{13}^{(2)}+\varphi_{12}^{(3)}\right)} \\ e^{i\left(\varphi_{13}^{(1)}+\varphi_{13}^{(2)}+\varphi_{13}^{(3)}\right)} \end{pmatrix} \qquad \text{Eq. (15)}$$

A transformation can be applied to the Hilbert space, H, which leads to a new basis, $$\left\{ e^{i\left(\varphi_{12}^{(2)}+\varphi_{12}^{(3)}\right)}e^{-i\left(\frac{2}{3}\varphi_{12}^{(2)}+\frac{1}{3}\varphi_{12}^{(3)}\right)}\Big|000\rangle, e^{i\left(\varphi_{12}^{(2)}+\varphi_{13}^{(3)}\right)}e^{-i\left(\frac{2}{3}\varphi_{12}^{(2)}+\frac{1}{3}\varphi_{13}^{(3)}\right)}\Big|001\rangle, \right.$$
$$\left. \ldots, e^{i\left(\varphi_{13}^{(2)}+\varphi_{13}^{(3)}\right)}e^{-i\left(\frac{2}{3}\varphi_{13}^{(2)}+\frac{1}{3}\varphi_{13}^{(3)}\right)}\Big|111\rangle \right\}.$$

In this basis, the three phi-bit state vector takes the form:

$$\vec{V}' = \begin{pmatrix} e^{i\left(\varphi_{12}^{(1)}+\frac{2}{3}\varphi_{12}^{(2)}+\frac{1}{3}\varphi_{12}^{(3)}\right)} \\ e^{i\left(\varphi_{12}^{(1)}+\frac{2}{3}\varphi_{12}^{(2)}+\frac{1}{3}\varphi_{13}^{(3)}\right)} \\ e^{i\left(\varphi_{12}^{(1)}+\frac{2}{3}\varphi_{13}^{(2)}+\frac{1}{3}\varphi_{12}^{(3)}\right)} \\ e^{i\left(\varphi_{13}^{(1)}+\frac{2}{3}\varphi_{12}^{(2)}+\frac{1}{3}\varphi_{12}^{(3)}\right)} \\ e^{i\left(\varphi_{12}^{(1)}+\frac{2}{3}\varphi_{13}^{(2)}+\frac{1}{3}\varphi_{13}^{(3)}\right)} \\ e^{i\left(\varphi_{13}^{(1)}+\frac{2}{3}\varphi_{12}^{(2)}+\frac{1}{3}\varphi_{13}^{(3)}\right)} \\ e^{i\left(\varphi_{13}^{(1)}+\frac{2}{3}\varphi_{13}^{(2)}+\frac{1}{3}\varphi_{12}^{(3)}\right)} \\ e^{i\left(\varphi_{13}^{(1)}+\frac{2}{3}\varphi_{13}^{(2)}+\frac{1}{3}\varphi_{13}^{(3)}\right)} \end{pmatrix} \qquad \text{Eq. (16)}$$

Assume next that the three phi-bits have relative phases that vary in the same way upon tuning one of the driving frequencies. In that case $\varphi_{12}^{(1)}=\varphi_{12}^{(2)}=\varphi_{12}^{(3)}=f(\Delta v)$ and $\varphi_{13}^{(1)}=\varphi_{13}^{(2)}=\varphi_{13}^{(3)}=g(\Delta v)$ where $\Delta v$ is a driving frequency tuning parameter. This parameter enables the systems and techniques described herein to be used to span a region of the Hilbert space, H through the variations in the components of vector $\vec{V}'$. Further suppose that the functions $f$ and $g$ cross for a given value of the tuning parameter $\Delta v^*$. At this tuning frequency, the state vector becomes:

$$\vec{V}' = e^{i2f(\Delta v^*)}\begin{pmatrix} 1 \\ 1 \\ 1 \\ 1 \\ 1 \\ 1 \\ 1 \\ 1 \end{pmatrix}$$

which to within a normalizing factor and a general phase is the vector:

$$\vec{V}'' = \frac{1}{2\sqrt{2}}\begin{pmatrix} 1 \\ 1 \\ 1 \\ 1 \\ 1 \\ 1 \\ 1 \\ 1 \end{pmatrix}.$$

By applying the unitary transformation (i.e., applying a rotation to the Hilbert space):

$$\vec{U} = \frac{1}{2\sqrt{2}} \begin{pmatrix} 1 & 1 & 1 & 1 & 1 & 1 & 1 & 1 \\ -2 & 2 & 0 & 0 & 0 & 0 & 0 & 0 \\ -\sqrt{2} & -\sqrt{2} & \sqrt{2} & \sqrt{2} & 0 & 0 & 0 & 0 \\ 0 & 0 & -2 & 2 & 0 & 0 & 0 & 0 \\ -1 & -1 & -1 & -1 & 1 & 1 & 1 & 1 \\ 0 & 0 & 0 & 0 & -2 & 2 & 0 & 0 \\ 0 & 0 & 0 & 0 & -\sqrt{2} & -\sqrt{2} & \sqrt{2} & \sqrt{2} \\ 0 & 0 & 0 & 0 & 0 & 0 & -2 & 2 \end{pmatrix}$$

to the vector $\vec{V}''$, yields obtains a pure state vector in the space, H:

$$\vec{U}\vec{V}'' = \begin{pmatrix} 1 \\ 0 \\ 0 \\ 0 \\ 0 \\ 0 \\ 0 \\ 0 \\ 0 \end{pmatrix} = \vec{V}^\partial \qquad \text{Eq. (17)}$$

Applying the unitary transformation, $\vec{U}$, to the general form of the state vector, $\vec{V}'$, that is for a tuning frequency different from $\Delta v^*$, yields:

$$\vec{W} = \vec{U}\vec{V}' = \frac{1}{8} \begin{pmatrix} \left(e^{i\varphi_{12}^{(1)}} + e^{i\varphi_{13}^{(1)}}\right)z_2 \\ 2e^{i\left(\varphi_{12}^{(1)}+\frac{2}{3}\varphi_{12}^{(2)}\right)}z_0 \\ \sqrt{2}\,e^{i\varphi_{12}^{(1)}}z_3 \\ 2e^{i\left(\varphi_{(12)}^{(1)}+\frac{2}{3}\varphi_{13}^{(2)}\right)}z_0 \\ \left(e^{i\varphi_{13}^{(1)}} - e^{i\varphi_{12}^{(1)}}\right)z_2 \\ 2e^{i\left(\varphi_{(13)}^{(1)}+\frac{2}{3}\varphi_{12}^{(2)}\right)}z_0 \\ \sqrt{2}\,e^{i\varphi_{13}^{(1)}}z_3 \\ 2e^{i\left(\varphi_{(13)}^{(1)}+\frac{2}{3}\varphi_{13}^{(2)}\right)}z_0 \end{pmatrix} \qquad \text{Eq. (18)}$$

with $$z_0 = e^{i\frac{1}{3}\varphi_{13}^{(3)}} - e^{i\frac{1}{3}\varphi_{12}^{(3)}}$$

$$z_1 = e^{i\frac{1}{3}\varphi_{12}^{(3)}} + e^{i\frac{1}{3}\varphi_{13}^{(3)}}$$

$$z_2 = \left(e^{i\frac{2}{3}\varphi_{12}^{(2)}} + e^{i\frac{2}{3}\varphi_{13}^{(2)}}\right)z_1$$

$$z_3 = \left(e^{i\frac{2}{3}\varphi_{13}^{(2)}} - e^{i\frac{2}{3}\varphi_{12}^{(2)}}\right)z_1.$$

$\vec{W}$ in Eq. (18) is a new representation of the three phi-bit state in the Hilbert space, H. This vector is non-separable (i.e., classically entangled) for most values of the phase differences, that is, the $8\times1$ vector cannot be factored into the tensor product of three $2\times1$ vectors. Note that here, entanglement like in quantum mechanics is not needed to achieve correlations between subsystems in multipartite composite systems. The phi-bits are naturally nonlinearly correlated. Non-separability is useful here in enabling a more complete coverage of the multi phi-bit Hilbert space. The procedure described above relates the six experimentally controllable and measurable variables $\varphi_{12}^{(1)}$, $\varphi_{13}^{(1)}$, $\varphi_{12}^{(2)}$, $\varphi_{13}^{(2)}$, $\varphi_{12}^{(3)}$, $\varphi_{13}^{(3)}$, $\varphi_{12}^{(1)},\varphi_{13}^{(1)},\varphi_{12}^{(2)},\varphi_{13}^{(2)},\varphi_{12}^{(3)},\varphi_{13}^{(3)}$ to the eight components of Eq. (18). In other words, it relates a space of phase differences that scales linearly with the number $N$ logical phi-bits to an exponentially scaling complex space of dimension, $2^N$.

By tuning the driving frequency (or driving frequencies), i.e., manipulating the phase difference in the linear space, the systems and techniques described herein can be seen to act or effectively operate on vectors in the exponentially complex space. Furthermore, because the phi-bits are chosen such that the six phase differences relate to only two tunable functions $f$ and g, the systems and techniques can be used to relate a two-dimensional physical space to a $2^3$-dimensional space. The two-dimensional space can be spanned with a single tuning frequency parameter. This single parameter operates by rotating the 8-dimensional complex state vector of the three phi-bits. An example of such an operation is described in greater depth below.

Expressing $\vec{W}$ in terms of $f$ and $g$ yields:

$$\vec{W} = \frac{1}{8} \begin{pmatrix} s_1 \\ s_2 \\ s_3 \\ s_4 \\ s_5 \\ s_6 \\ s_7 \\ s_8 \end{pmatrix} \qquad \text{Eq. (19)}$$

with $$s_1 = \left(e^{if} + e^{ig}\right)\left(e^{i\frac{1}{3}f} + e^{i\frac{1}{3}g}\right)\left(e^{i\frac{2}{3}f} + e^{i\frac{2}{3}g}\right)$$

$$s_2 = 2e^{if}\left(e^{i\frac{1}{3}g} - e^{i\frac{1}{3}f}\right)$$

$$s_3 = \sqrt{2}\,e^{if}\left(e^{i\frac{2}{3}g} - e^{i\frac{2}{3}f}\right)\left(e^{i\frac{1}{3}f} + e^{i\frac{1}{3}g}\right)$$

$$s_4 = 2e^{i\left(f+\frac{2}{3}g\right)}\left(e^{i\frac{1}{3}g} - e^{i\frac{1}{3}f}\right)$$

$$s_5 = \left(e^{ig} - e^{if}\right)\left(e^{i\frac{1}{3}f} + e^{i\frac{1}{3}g}\right)\left(e^{i\frac{2}{3}f} + e^{i\frac{2}{3}g}\right)$$

$$s_6 = 2e^{i\left(g+\frac{2}{3}f\right)}\left(e^{i\frac{1}{3}g} - e^{i\frac{1}{3}f}\right)$$

$$s_7 = \sqrt{2}\,e^{ig}\left(e^{i\frac{2}{3}g} - e^{i\frac{2}{3}f}\right)\left(e^{i\frac{1}{3}f} + e^{i\frac{1}{3}g}\right)$$

$$s_8 = 2e^{ig}\left(e^{i\frac{1}{3}g} - e^{i\frac{1}{3}f}\right)$$

Figure 11:
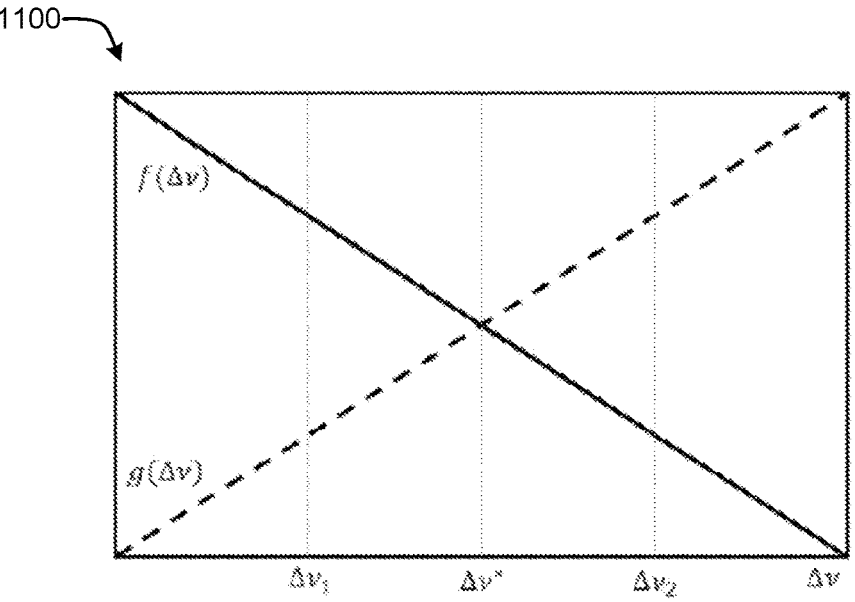
FIG. 11 is a diagram depicting a schematic representation of phase difference functions as the frequency tuning parameter $\Delta v$.

Assume that the functions $f$ and $g$ take the respective forms illustrated in the graph 1100 of FIG. 11. Although FIG. 11 depicts linear functions, the functions $f$ and $g$ do not need to be linear but only need to cross and be symmetric about the crossing point. Upon tuning one of the driving frequencies from $\Delta v_1$ and $\Delta v_2$, the values of $f$ and $g$ are swapped in the low-dimension space of phase difference functions. This physical operation results in a change of the 8-dimensional state vector:

$$\overrightarrow{W'} = \frac{1}{8}\begin{pmatrix} s_1 \\ -s_8 \\ -s_7 \\ -s_6 \\ -s_5 \\ -s_4 \\ -s_3 \\ -s_2 \end{pmatrix} \qquad \text{Eq. (20)}$$

$\overrightarrow{W'}\overline{W'}$ is related to $\overrightarrow{W}W$ by a unitary transformation, $\overleftrightarrow{T}\overline{T}$, such that $\overrightarrow{W'}=\overleftrightarrow{T}\overrightarrow{W}$ $\overline{W'} = \overleftrightarrow{T}\overrightarrow{W}$ with:

$$\overleftrightarrow{T} = \begin{pmatrix} 1 & 0 & 0 & 0 & 0 & 0 & 0 & 0 \\ 0 & 0 & 0 & 0 & 0 & 0 & 0 & -1 \\ 0 & 0 & 0 & 0 & 0 & 0 & -1 & 0 \\ 0 & 0 & 0 & 0 & 0 & -1 & 0 & 0 \\ 0 & 0 & 0 & 0 & -1 & 0 & 0 & 0 \\ 0 & 0 & 0 & -1 & 0 & 0 & 0 & 0 \\ 0 & 0 & -1 & 0 & 0 & 0 & 0 & 0 \\ 0 & -1 & 0 & 0 & 0 & 0 & 0 & 0 \end{pmatrix} \qquad \text{Eq. (21)}$$

This non-trivial three phi-bit operation in the exponentially complex 8-dimensional Hilbert space reorders the components of the state vector except the first one and adds a $\pi$ phase to the permuted components. Note that this operation is independent of the specific value of $f$ and $g$. One can choose different values for $\Delta v_1$ corresponding to a whole range of possible 8×1 input vectors and apply the transformation $\overleftrightarrow{T}$ by tuning the frequency parameter to $\Delta v_2 = \Delta v^* + \Delta v_1$ to obtain the corresponding 8×1 output vector. This can be done by simply monitoring the value of the phase differences $f$ and $g$. Since phi-bits are classical entities, one can operate on them while continuously measuring their phase characteristics. The $\overleftrightarrow{T}$ operation is completely input independent as long as the input belongs to the accessible region of the Hilbert space, H.

Figure 12:
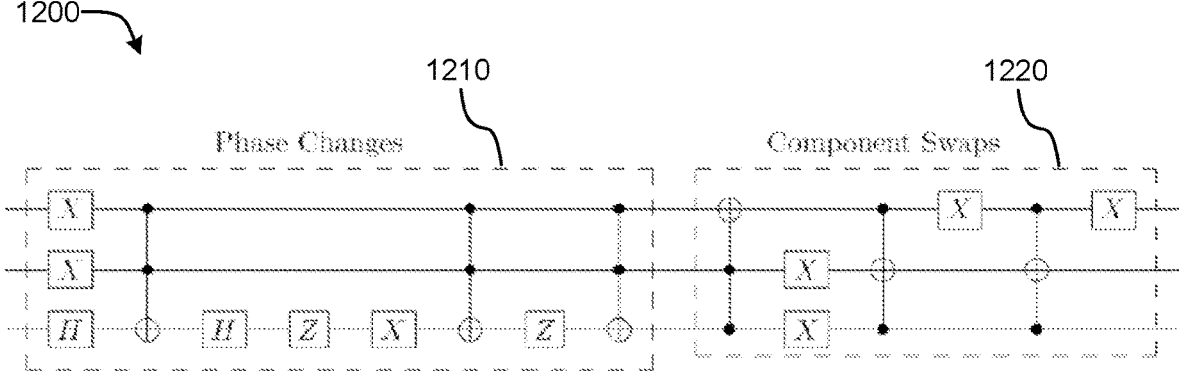
FIG. 12 is a diagram illustrating an example architecture of a three qubits quantum circuit that can be used to implement the same unitary operation as a transformation $\bar{T}$, with a one qubit Pauli X gate "X", a one qubit Pauli Z gate "Z", and a one qubit Hadamard gate "H" combined with six Toffoli gates.

To contrast phi-bit-based computing with quantum computing, FIG. 12 depicts an example quantum circuit architecture 1200 that operates in the same way as the three phi-bit unitary matrix, $\overleftrightarrow{T}\overline{T}$. A quantum circuit is a sequence of quantum gates that operates on qubits to enable a quantum computation. The quantum circuit 1200 operates on three qubit states. Simultaneous operations are tensor products of single qubit gates such as the Pauli X, Z and Hadamard (H) gates. Additionally, the quantum circuit 1200 utilizes three qubit Toffoli gates that are often only realizable as circuits of single and two qubit operations. The first block 1210 of the quantum circuit 1200 applies the $\pi$ phase change to the appropriate components of the 8× $8 \times 1$ input vector. The second circuit block 1220 swaps components of the vector. Note that the quantum circuit 1200 depicted in FIG. 12 is provided for purposes of example as various other such circuits may also be seen to implement the operation of $\overleftrightarrow{T}\overline{T}$.

The three phi-bit unitary transformation (i.e., three phi-bit gate), $\overleftrightarrow{T}\overline{T}$, does not need to be decomposed into a sequence of smaller gates to be physically realized. It is an example of a full muti phi-bit operation that can be conducted in a single manipulation of the experimental system.

In one illustrative example, an experimental set-up can be implemented based on a metastructure of elastically coupled aluminum rod-like acoustic waveguides, as has been previously described above. The rods are arranged in a linear array coupled along their length with epoxy resin. Three separate signal generators and amplifiers are used to drive piezoelectric transducers. Driving and detecting transducers are attached to the opposite ends of the rods with ultrasonic coupling agent. The signals generated by the detecting transducers enter an oscilloscope via independent input channels for measurement of phases. The array of waveguides is suspended by thin threads for isolation. When driven externally at two primary frequencies, this metastructure supports a displacement field, which when partitioned into the frequency domain leads to modes with secondary frequencies associated with logical phi-bits. Rod 1 is driven at a frequency $f_1 = 62$ kHz$+\Delta v$ $f_1 = 62kHz + \Delta v$, and rod 2 at a frequency $f_2 = 70$ kHz $f_2 = 70kHz$. $\Delta v$ $\Delta v$ is varied by increments of 50 Hz in the interval [0,8].

Figure 13:
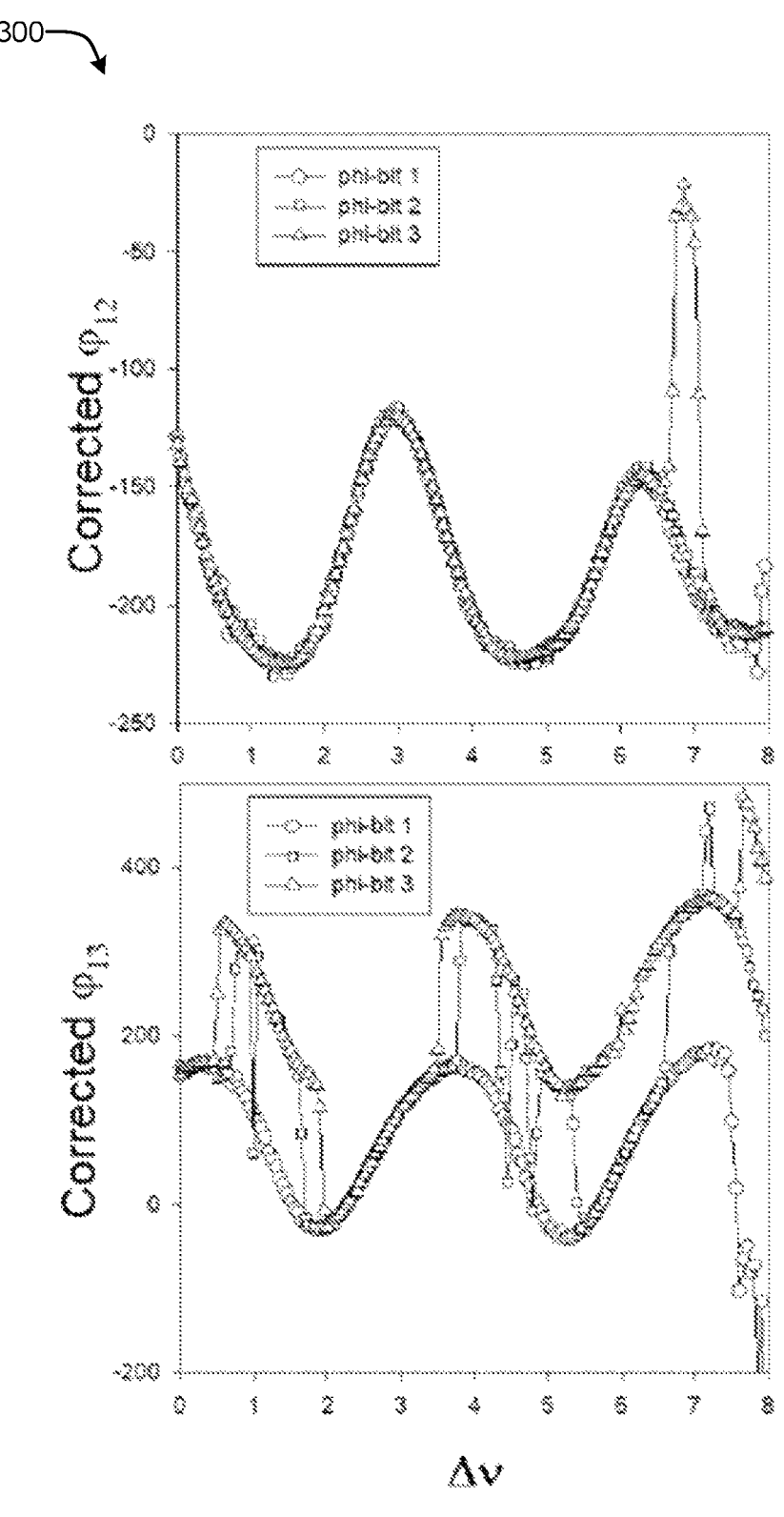
FIG. 13 is a graph depicting corrected measured phases of three phi-bits as functions of the driving frequency tuning parameter $\Delta v$, exhibiting phase jumps overlapping with common background monotonous variations.

In one illustrative example, three phi-bit modes, $j = 1,2,3$, with nonlinear frequencies $f^{(1)}=4f_1-3f_2$, $f^{(2)}=4f_1-2f_2$ $f^{(1)} = 4f_1 - 3f_2, f^{(2)} = 4f_1 - 2f_2$ and $f^{(3)}=4f_1-f_2$ $f^{(3)} = 4f_1 - f_2$ are considered. These three phi-bits are chosen to have the same coefficients, $p^{(j)}$ $p^{(j)}$. The six measured phases $\varphi_{12}{}^{(j)}$, $\varphi_{13}{}^{(j)}$ $\varphi_{12}{}^{(j)}, \varphi_{13}{}^{(j)}$ exhibit several remarkable features in the form of upward or downward jumps superposed onto monotonous background variations. The jumps amount to phase changes on the order of $\pi$ $\pi$ (180°). FIG. 13 depicts a graph 1300 in which the measured phases $\varphi_{12(3)}{}^{(j)}$ $\varphi_{12(3)}{}^{(j)}$ of phi-bits $j = 1,2$, and $3$ have been corrected by a translation of $+q^{(j)}\times C_{12(3)}$ $+q^{(j)} \times C_{12(3)}$, where the $C_{12(3)}$ $C_{12(3)}$ are constants, to overlap the background variations.

The origin of the phase jumps and background variations in terms of nonlinear interactions of driven acoustic waves in the metastructure have been described above. By subtracting easily identifiable contributions of the phase jumps to the overall experimental data, the background contribution to the phases common to the three phi-bits can be extracted.

Figure 14:
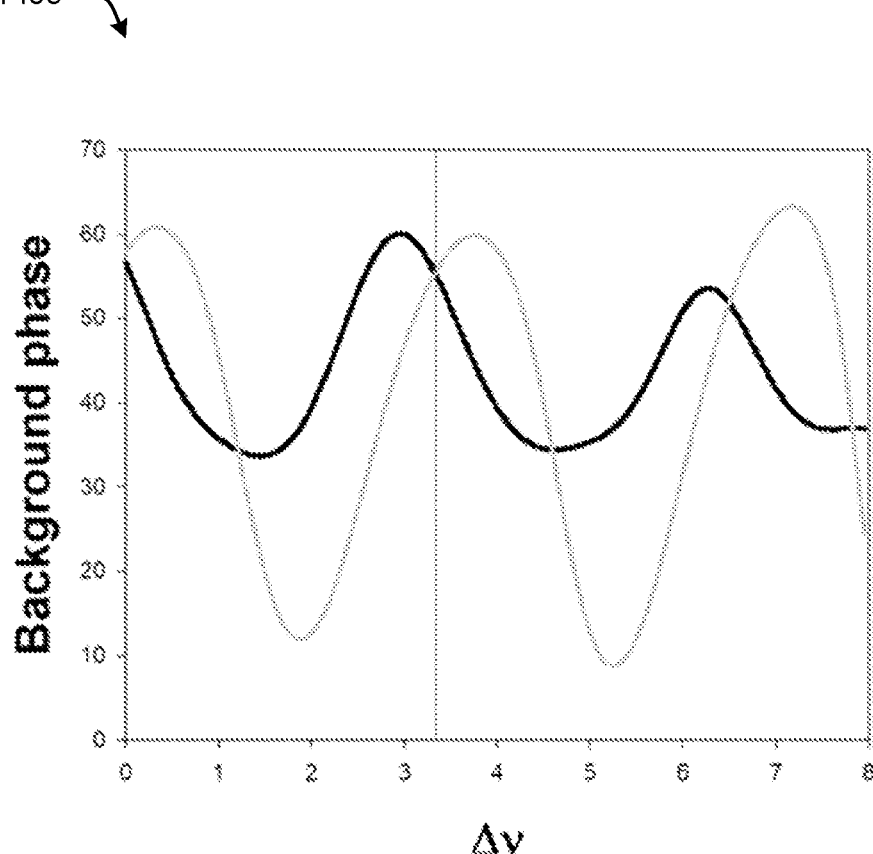
FIG. 14 is a graph depicting common background phases of three phi-bits corresponding to the functions $f$ (black line) and $g$ (grey line) as the driving frequency tuning parameter $\Delta v$ is varied, with a thin vertical line corresponding to $\Delta v^* \sim 3.3$ kHz where $f = g$.

FIG. 14 is a graph 1400 depicting the common background variations $\varphi'_{12}{}^{(1)}=\varphi'_{12}{}^{(2)}=\varphi'_{12}{}^{(3)}=f(\Delta v)$ $\varphi'^{(1)}_{12} = \varphi'^{(2)}_{12} = \varphi'^{(3)}_{12} = f(\Delta v)$ and $\varphi'_{13}{}^{(1)}=\varphi'_{13}{}^{(2)}=\varphi'_{13}{}^{(3)}=g$ $(\Delta v)$ $\varphi'^{(1)}_{13} = \varphi'^{(2)}_{13} = \varphi'^{(3)}_{13} = g(\Delta v)$. Since phases are always relative, in graph 1400 the background phase, $g$, has been obtained by subtracting a general phase of 71 degrees to achieve overlap with $f$. Note that these corrections, subtractions, and translations are well defined and controllable algebraic manipulations in the low-dimensional physical space of the system and therefore, do not affect the generality of the mapping between the three phi-bit physical space and the associated exponentially complex Hilbert space.

FIG. 14 demonstrates the achievability of experimental conditions similar to those describe above with respect to FIG. 11, in the vicinity of the tuning frequency $\Delta v^* {\sim} 3.3 kHz$. The approximate symmetry of the experimentally derived functions $f$ and $g$ about $\Delta v^*$ $\Delta v^*$ enables the use of the three phi-bits, 1, 2 and 3 to realize experimentally the unitary operation $\overleftrightarrow{T}\overline{T}$. Note also that there is a range of $\overrightarrow{\Delta v}$ to the left of $\Delta v^*$ of approximately of 0.3 kHz, that produces different values of $\overrightarrow{f}$ and $\overrightarrow{g}$ on which the systems and techniques described herein can operate. These different values of $\overrightarrow{f}$ and $\overrightarrow{g}$ inserted into Eq. (19), correspond to the accessible region of the Hilbert space, $\overrightarrow{H}$, i.e., the state vectors, $\vec{W} \overrightarrow{|W}$, on which the transformation $\overrightarrow{T|l}$ can operate.

This operation is completely independent of the specific value of the input within this accessible region of $\overrightarrow{H}$. By symmetry, outputs, $\vec{W} \overrightarrow{|W'}$ will span another region of the Hilbert space corresponding to the exchanged values of $f$ and $g$ on the right side of $\Delta^*$. This experimental data demonstrates the existence of logical phi-bits supported by an externally driven acoustic waveguide metastructure that can be used to realize a nontrivial three phi-bit unitary operation that would be challenging to realize in a quantum computer.

A correspondence between the state of correlated logical phi-bits represented in a low-dimensional linearly scaling physical space and their state representation in a high-dimensional, exponentially scaling Hilbert space has been established. The logical phi-bits are nonlinear acoustic waves, classical analogues of qubits, that can be supported by a metastructure constituted of an externally driven array of acoustic waveguides. By manipulating the physical variables and measuring them in the physical space of three phi-bits with at most 2×3=6 $\overline{2 \times 3 = 6}$ dimensions, the systems and techniques described herein can be used to operate on the coherent superposition of states in the $2^3=8$ $\overline{2^3 = 8}$ dimensional Hilbert space via a three phi-bit nontrivial unitary operation, i.e., a three phi-bit gate. This operation can be performed on a range of input states covering a nontrivial region of the three phi-bit Hilbert space. This three phi-bit gate can be represented by a 8×8 $\overline{8 \times 8}$ unitary matrix that swaps seven components of the three phi-bits 8×1 state vector and adds a $\pi$ $\overline{[\pi}$ phase to the permuted components. Realizing this unitary operation in a quantum computer would involve the challenging task of applying a long sequence of smaller single and two qubit gates to a three-qubit system. Also demonstrated herein are conditions to physically realize the three phi-bit gate exist in an experimental laboratory scale metastructure composed of coupled rod-like acoustic waveguides. In contrast to multi-partite quantum systems, the coherent superpositions of states of the three logical phi-bits system on which the systems and techniques described herein can operate are stable, do not decohere, and are directly measurable. Aspects of the present disclosure demonstrate the use of a nonlinear acoustic metastructure to realize quantum-like coherent superpositions of states in an exponentially complex Hilbert space on which one can effectively operate with a nontrivial unitary operation analogous to a quantum gate.

Figure 15:
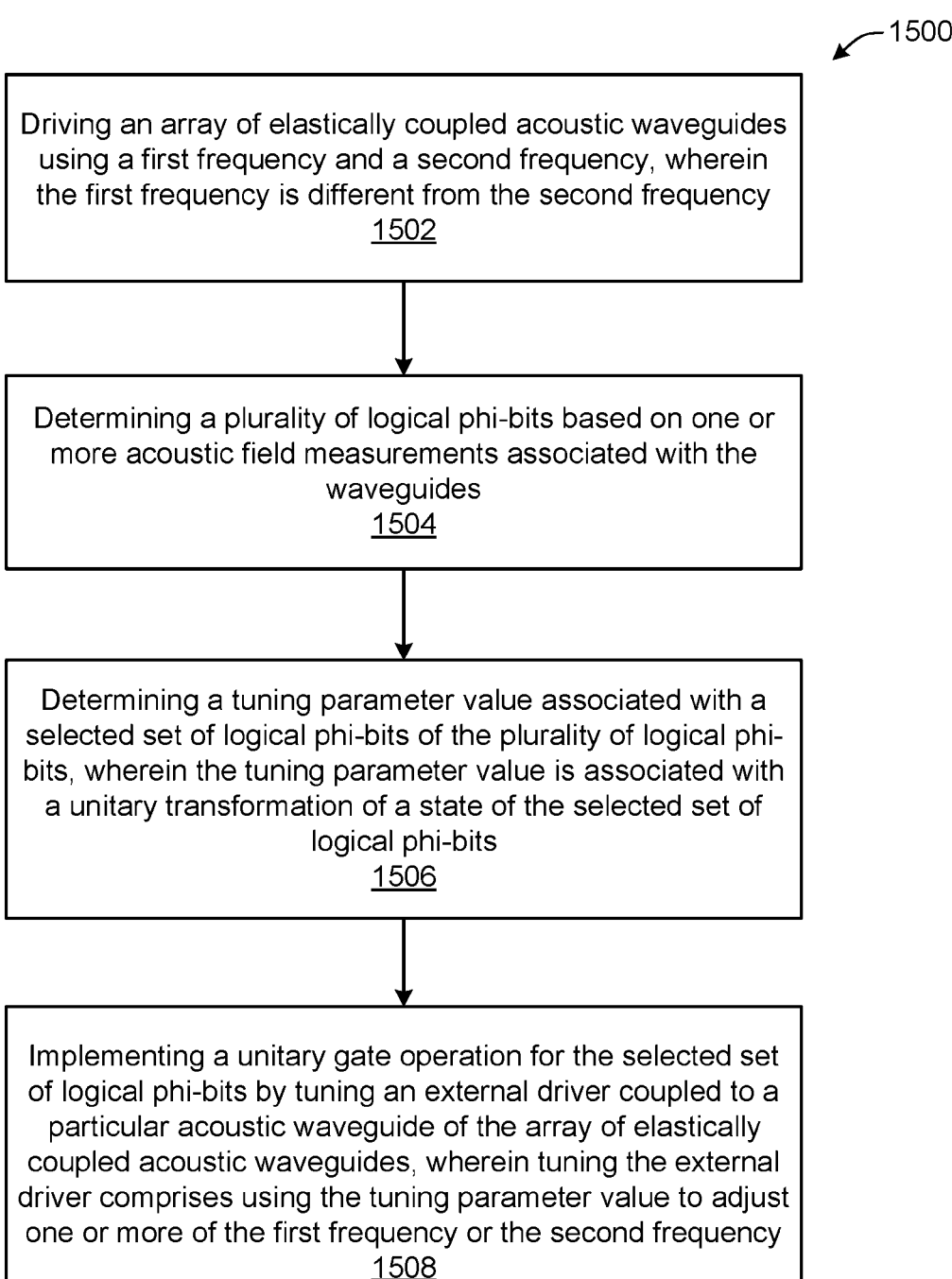
FIG. 15 is a flow diagram illustrating an example of a process for implementing a quantum analogue gate operation using one or more logical phi-bits.

FIG. 15 is a flow diagram illustrating an example of a process 1500 for implementing a quantum analogue gate operation using one or more logical phi-bits. For example, the quantum analogue (e.g., quantum-like) gate can include one or more of a single-bit gate operation, such as a Hadamard or phase gate operation; a two-bit gate operation, such as a controlled-NOT (C-NOT) gate operation; a three-bit gate operation; and/or various other multi-bit gate operations. In some aspects, the quantum-like gate operations can use one or more logical phi-bits. For example, the logical phi-bits can be acoustic quantum bit (e.g., qubit) analogues that are the same as or similar to those described above. Although the example process 1500 depicts a particular sequence of operations, the sequence may be altered without departing from the scope of the present disclosure. For example, some of the operations depicted may be performed in parallel or in a different sequence that does not materially affect the function of the process 300. In some examples, different components of an example device or system that implements the process 1500 may perform functions at substantially the same time or in a specific sequence.

At block 1502, the process 1500 includes driving an array of elastically coupled acoustic waveguides using a first frequency and a second frequency, wherein the first frequency is different from the second frequency. For example, the array of elastically coupled acoustic waveguides can be provided in or otherwise associated with an acoustic meta-material. In some embodiments, the array can be a parallel or linear array that includes three elastically coupled acoustic waveguides. The waveguides can be aluminum rods having circular cross-sections, arranged in a parallel or linear fashion with lateral gaps filled with epoxy. One or more ultrasonic transducers can be used to drive the array of waveguides, for example with a first driving transducer attached to a first waveguide and producing a sinusoidal signal with frequency $f_1$ and a second driving transducer attached to a second waveguide and producing a sinusoidal signal with frequency $f_2$.

At block 1504, the process 1500 includes determining a plurality of logical phi-bits based on one or more displacement field measurements associated with the waveguides. For example, the displacement field measurements can be obtained from one or more detecting transducers located at opposite ends of the waveguides (e.g., rods) from the driving transducer(s). In some embodiments, three detecting transducers can be provided for an array of three elastically coupled acoustic waveguides. In some examples, the one or more displacement field measurements can comprise a Fourier sum of a large number of linear and nonlinear modes, each with its own characteristic frequency. Determining the plurality of logical phi-bits can be based on the nonlinear modes of the displacement field measurements. In some examples, the plurality of logical phi-bits can include 16 logical phi-bits, although it is appreciated that a greater or lesser number of logical phi-bits can also be utilized without departing from the scope of the present disclosure.

At block 1506, the process 1500 includes determining a tuning parameter value associated with a selected set of logical phi-bits of the plurality of logical phi-bits, wherein the tuning parameter value is associated with a unitary transformation of a state of the selected set of logical phi-bits. For example, the tuning parameter can be a frequency tuning parameter. In some embodiments, the tuning parameter can be the frequency tuning parameter $\Delta v$ $\overline{\Delta v}$. The tuning parameter can additionally, or alternatively, include one or more of the tuning parameters listed for the various pairs of logical phi-bits as provided in Appendix A. In some examples, the tuning parameter value comprises a frequency tuning delta value indicative of an increment or decrement in a driving frequency of the array of elastically coupled acoustic waveguides. For instance, the tuning parameter value can be the same as or similar to one or more of the tuning parameter values $\Delta v$ and/or $\Delta v^*$ described previously above. The tuning parameter value can be indicative of an increase in one or more driving frequencies associated with driving corresponding acoustic waveguides of the array of elastically coupled acoustic waveguides. The tuning parameter value can be indicative of a decrease in one or more driving frequencies associated with driving corresponding acoustic waveguides of the array of elastically coupled acoustic waveguides.

In some aspects, the selected set of logical phi-bits includes one logical phi-bit of the plurality of logical phi-bits. For example, the selected one logical phi-bit can be used to implement a unitary gate operation comprising a single-bit gate operation. In some embodiments, the selected one logical phi-bit can be used to implement a unitary gate operation comprising a Hadamard gate operation, with a unitary transformation based on a Hadamard gate matrix. In some examples, the selected one logical phi-bit can be used to implement a unitary gate operation comprising a phase shift gate operation, wherein the phase shift gate operation is implemented to phase shift a first component of a phi-bit representation of the one logical phi-bit while keeping a second component of the phi-bit representation of the one logical phi-bit constant.

In some cases, the unitary gate operation is a two-bit gate operation and the selected set of logical phi-bits includes two logical phi-bits of the plurality of logical phi-bits. For instance, the unitary gate operation can be a two-bit controlled-NOT (C-NOT) gate operation implemented using a given pair of logical phi-bits of the plurality of logical phi-bits.

In some cases, the unitary gate operation is a multi-bit gate operation associated with three or more bits, and the selected set of logical phi-bits includes three or more logical phi-bits of the plurality of logical phi-bits.

At block 1508, the process 1500 includes implementing a unitary gate operation for the selected set of logical phi-bits by tuning an external driver coupled to a particular acoustic waveguide of the array of elastically coupled acoustic waveguides, wherein tuning the external driver comprises using the tuning parameter value to adjust one or more of the first frequency or the second frequency.

In some cases, adjusting the first frequency or the second frequency causes the unitary transformation of the state of the selected set of logical phi-bits. In some examples, one or more respective phi-bit states of the set of logical phi-bits are tuned based on adjusting the first frequency or the second frequency. In some aspects, adjusting the first frequency or the second frequency tunes one or more respective phi-bit states of the set of logical phi-bits based on changing one or more relative phases measured for each acoustic waveguide corresponding to the selected set of logical phi-bits. In one illustrative example, adjusting the first frequency or the second frequency tunes the selected set of logical phi-bits based on one or more nonlinear phase jumps as functions of the tuning parameter value.

As mentioned above, in some cases the selected set of logical phi-bits includes one logical phi-bit of the plurality of logical phi-bits and the unitary gate operation is a Hadamard gate operation and the unitary transformation is based on a Hadamard gate matrix. In another example, the selected set of logical phi-bits includes one logical phi-bit of the plurality of logical phi-bits and the unitary gate operation is a phase shift gate operation implemented to phase shift a first component of a phi-bit representation of the one logical phi-bit while keeping a second component of the phi-bit representation of the one logical phi-bit constant.

As also mentioned above, in another example the unitary gate operation is a two-bit gate operation and the selected set of logical phi-bits includes two logical phi-bits of the plurality of logical phi-bits. In some cases, the two-bit gate operation is a controlled-NOT (C-NOT) gate operation performed using a given pair of logical phi-bits of the plurality of logical phi-bits. For instance, the C-NOT gate operation can be implemented based on tuning the external driver to change the first frequency by an amount equal to the tuning parameter value. In some cases, the C-NOT gate operation is implemented based on a plurality of relative phase differences determined between a first waveguide of the array associated with the first logical phi-bit of the pair and a second waveguide of the array associated with a second logical phi-bit of the pair. In some embodiments, adjusting the driving frequency of the external driver by the tuning parameter value causes a plurality of transformed relative phase differences between the first and second waveguides of the array. The plurality of transformed relative phase differences can correspond to a C-NOT unitary gate matrix applied to the plurality of relative phase differences.

In some aspects, the controlled-NOT (C-NOT) gate operation can be implemented for the given pair of logical phi-bits by detuning an external driver coupled to a first waveguide of the array of elastically coupled acoustic waveguides, wherein the detuning reduces the first frequency by the tuning parameter. For example, the tuning parameter $\Delta v$ $\Delta v$ can be applied to the first frequency $f_1$ produced by the first driving transducer coupled to the first waveguide. In some embodiments, the controlled C-NOT gate operation can be implemented based on or otherwise using a frequency transformation for a given four-vector state (e.g., for the four-vector $\vec{W}^{ij} \overline{|\vec{W}^{ij}|}$ of Eq. (2)), wherein the frequency transformation is determined to produce the C-NOT transformed counterpart for the given four-vector state.

In some cases, the unitary gate operation is a multi-bit gate operation associated with three or more bits and the selected set of logical phi-bits includes three or more logical phi-bits of the plurality of logical phi-bits. In some aspects, a first subset of phi-bit states are adjusted using a first tunable function parameterized with the tuning parameter value and a second subset of phi-bit states are adjusted using a second tunable function parameterized with the tuning parameter value. For instance, the first subset of phi-bit states can correspond to the phases associated with the first tunable function $f$ described above (e.g., $f(\Delta v)$). In some examples, the second subset of phi-bit states can correspond to the phases associated with the second tunable function g described above (e.g., $g(\Delta v)$).

In some aspects, tuning the external driver comprises detuning a first external driver coupled to a first acoustic waveguide of the array and used to produce the first frequency or detuning a second external driver coupled to a second acoustic waveguide of the array and used to produce the second frequency.

Claim language or other language reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, A and B and C, or any duplicate information or data (e.g., A and A, B and B, C and C, A and A and B, and so on), or any other ordering, duplication, or combination of A, B, and C. The language "at least one of" a set and/or "one or more" of a set does not limit the set to the items listed in the set. For example, claim language reciting "at least one of A and B" or "at least one of A or B" may mean A, B, or A and B, and may additionally include items not listed in the set of A and B.

Illustrative aspects of the disclosure include:

Aspect 1. A method comprising: driving an array of elastically coupled acoustic waveguides using a first frequency and a second frequency, wherein the first frequency is different from the second frequency; determining a plurality of logical phi-bits based on one or more acoustic field measurements associated with the waveguides; determining a tuning parameter value associated with a selected set of logical phi-bits of the plurality of logical phi-bits, wherein the tuning parameter value is associated with a unitary transformation of a state of the selected set of logical phi-bits; and implementing a unitary gate operation for the selected set of logical phi-bits by tuning an external driver coupled to a particular acoustic waveguide of the array of elastically coupled acoustic waveguides, wherein tuning the external driver comprises using the tuning parameter value to adjust one or more of the first frequency or the second frequency.

Aspect 2. The method of Aspect 1, wherein adjusting the first frequency or the second frequency causes the unitary transformation of the state of the selected set of logical phi-bits.

Aspect 3. The method of any of Aspects 1 to 2, wherein one or more respective phi-bit states of the set of logical phi-bits are tuned based on adjusting the first frequency or the second frequency.

Aspect 4. The method of any of Aspects 1 to 3, wherein adjusting the first frequency or the second frequency tunes one or more respective phi-bit states of the set of logical phi-bits based on changing one or more relative phases measured for each acoustic waveguide corresponding to the selected set of logical phi-bits.

Aspect 5. The method of any of Aspects 1 to 4, wherein adjusting the first frequency or the second frequency tunes the selected set of logical phi-bits based on one or more nonlinear phase jumps as functions of the tuning parameter value.

Aspect 6. The method of any of Aspects 1 to 5, wherein: the selected set of logical phi-bits includes one logical phi-bit of the plurality of logical phi-bits; and the unitary gate operation is a Hadamard gate operation and the unitary transformation is based on a Hadamard gate matrix.

Aspect 7. The method of any of Aspects 1 to 6, wherein: the selected set of logical phi-bits includes one logical phi-bit of the plurality of logical phi-bits; and the unitary gate operation is a phase shift gate operation implemented to phase shift a first component of a phi-bit representation of the one logical phi-bit while keeping a second component of the phi-bit representation of the one logical phi-bit constant.

Aspect 8. The method of any of Aspects 1 to 7, wherein: the unitary gate operation is a two-bit gate operation; and the selected set of logical phi-bits includes two logical phi-bits of the plurality of logical phi-bits.

Aspect 9. The method of any of Aspects 1 to 8, wherein the two-bit gate operation is a controlled-NOT (CNOT) gate operation using a given pair of logical phi-bits of the plurality of logical phi-bits, the C-NOT gate operation implemented based on tuning the external driver to change the first frequency by an amount equal to the tuning parameter value.

Aspect 10. The method of Aspect 9, wherein the C-NOT gate operation is implemented based on a plurality of relative phase differences determined between a first waveguide of the array associated with a first logical phi-bit of the pair and a second waveguide of the array associated with a second logical phi-bit of the pair.

Aspect 11. The method of Aspect 10, wherein: adjusting the driving frequency of the external driver by the tuning parameter value causes a plurality of transformed relative phase differences between the first and second waveguides of the array; and the plurality of transformed relative phase differences correspond to a C-NOT unitary gate matrix applied to the plurality of relative phase differences.

Aspect 12. The method of any of Aspects 1 to 11, wherein: the unitary gate operation is a multi-bit gate operation associated with three or more bits; and the selected set of logical phi-bits includes three or more logical phi-bits of the plurality of logical phi-bits.

Aspect 13. The method of Aspect 12, wherein: a first subset of phi-bit states are adjusted using a first tunable function parameterized with the tuning parameter value; and a second subset of phi-bit states are adjusted using a second tunable function parameterized with the tuning parameter value.

Aspect 14. The method of any of Aspects 1 to 13, wherein tuning the external driver comprises: detuning a first external driver coupled to a first acoustic waveguide of the array and used to produce the first frequency; or detuning a second external driver coupled to a second acoustic waveguide of the array and used to produce the second frequency.

Aspect 15. The method of any of Aspects 1 to 14, wherein the tuning parameter value comprises a frequency tuning delta value indicative of an increment or decrement in a driving frequency of the array of elastically coupled acoustic waveguides.

Aspect 16: An apparatus comprising one or more means for performing operations according to any of Aspects 1 to 15.

What is claimed is:

1. A method comprising:
driving an array of elastically coupled acoustic waveguides using a first frequency and a second frequency, wherein the first frequency is different from the second frequency;
determining a plurality of logical phi-bits based on one or more acoustic field measurements associated with the waveguides;
determining a tuning parameter value associated with a selected set of logical phi-bits of the plurality of logical phi-bits, wherein the tuning parameter value is associated with a unitary transformation of a state of the selected set of logical phi-bits; and
implementing a unitary gate operation for the selected set of logical phi-bits by tuning an external driver coupled to a particular acoustic waveguide of the array of elastically coupled acoustic waveguides, wherein tuning the external driver comprises using the tuning parameter value to adjust one or more of the first frequency or the second frequency.

2. The method of claim 1, wherein adjusting the first frequency or the second frequency causes the unitary transformation of the state of the selected set of logical phi-bits.

3. The method of claim 1, wherein one or more respective phi-bit states of the set of logical phi-bits are tuned based on adjusting the first frequency or the second frequency.

4. The method of claim 1, wherein adjusting the first frequency or the second frequency tunes one or more respective phi-bit states of the set of logical phi-bits based on changing one or more relative phases measured for each acoustic waveguide corresponding to the selected set of logical phi-bits.

5. The method of claim 1, wherein adjusting the first frequency or the second frequency tunes the selected set of logical phi-bits based on one or more nonlinear phase jumps as functions of the tuning parameter value.

6. The method of claim 1, wherein:

the selected set of logical phi-bits includes one logical phi-bit of the plurality of logical phi-bits; and the unitary gate operation is a Hadamard gate operation and the unitary transformation is based on a Hadamard gate matrix.

7. The method of claim 1, wherein:

the selected set of logical phi-bits includes one logical phi-bit of the plurality of logical phi-bits; and the unitary gate operation is a phase shift gate operation implemented to phase shift a first component of a phi-bit representation of the one logical phi-bit while keeping a second component of the phi-bit representation of the one logical phi-bit constant.

8. The method of claim 1, wherein:

the unitary gate operation is a two-bit gate operation; and the selected set of logical phi-bits includes two logical phi-bits of the plurality of logical phi-bits.

9. The method of claim 8, wherein the two-bit gate operation is a controlled-NOT (C-NOT) gate operation using a given pair of logical phi-bits of the plurality of logical phi-bits, the C-NOT gate operation implemented based on tuning the external driver to change the first frequency by an amount equal to the tuning parameter value.

10. The method of claim 9, wherein the C-NOT gate operation is implemented based on a plurality of relative phase differences determined between a first waveguide of the array associated with a first logical phi-bit of the pair and a second waveguide of the array associated with a second logical phi-bit of the pair.

11. The method of claim 10, wherein:

adjusting the driving frequency of the external driver by the tuning parameter value causes a plurality of transformed relative phase differences between the first and second waveguides of the array; and the plurality of transformed relative phase differences correspond to a C-NOT unitary gate matrix applied to the plurality of relative phase differences.

12. The method of claim 1, wherein:

the unitary gate operation is a multi-bit gate operation associated with three or more bits; and the selected set of logical phi-bits includes three or more logical phi-bits of the plurality of logical phi-bits.

13. The method of claim 12, wherein:

a first subset of phi-bit states are adjusted using a first tunable function parameterized with the tuning parameter value; and a second subset of phi-bit states are adjusted using a second tunable function parameterized with the tuning parameter value.

14. The method of claim 1, wherein tuning the external driver comprises:

detuning a first external driver coupled to a first acoustic waveguide of the array and used to produce the first frequency; or detuning a second external driver coupled to a second acoustic waveguide of the array and used to produce the second frequency.

15. The method of claim 1, wherein the tuning parameter value comprises a frequency tuning delta value indicative of an increment or decrement in a driving frequency of the array of elastically coupled acoustic waveguides.

* * * * *